United States Patent
Kang et al.

(10) Patent No.: US 11,228,326 B2
(45) Date of Patent: Jan. 18, 2022

(54) RADIO-FREQUENCY INTEGRATED CHIP CONFIGURED TO SUPPORT CARRIER AGGREGATION AND WIRELESS COMMUNICATION APPARATUS INCLUDING THE SAME

(71) Applicant: SAMSUNG ELECTRONICS CO., LTD., Suwon-si (KR)

(72) Inventors: Byoungjoong Kang, Incheon (KR); Jungwoo Kim, Seoul (KR); Pilsung Jang, Uijeongbu-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 148 days.

(21) Appl. No.: 16/796,201

(22) Filed: Feb. 20, 2020

(65) Prior Publication Data
US 2021/0119649 A1    Apr. 22, 2021

(30) Foreign Application Priority Data
Oct. 18, 2019    (KR) .................. 10-2019-0130185

(51) Int. Cl.
*H04B 1/00*    (2006.01)
*H03F 3/195*    (2006.01)
*H04B 7/0413*    (2017.01)

(52) U.S. Cl.
CPC .......... *H04B 1/0053* (2013.01); *H03F 3/195* (2013.01); *H04B 7/0413* (2013.01); *H03F 2200/294* (2013.01); *H03F 2200/451* (2013.01)

(58) Field of Classification Search
CPC ..... H04B 1/0053; H04B 7/0413; H03F 3/195; H03F 2200/294; H03F 2200/451
See application file for complete search history.

(56) References Cited

U.S. PATENT DOCUMENTS 9,300,420 B2    3/2016    Chang et al.
9,473,336 B2    10/2016   Pan et al.
(Continued)

OTHER PUBLICATIONS

Tang et al., "An LTE-A Multimode Multiband RF Transceiver with 4RX/2TX Inter-Band Carrier Aggregation, 2-Carrier 4×4 MIMO with 256QAM and HPUE Capability in 28nm CMOS", 2019 IEEE International Solid-State Circuits Conference, Feb. 20, 2019, pp. 350-351, 3 pages total.

(Continued)

*Primary Examiner* — Nguyen T Vo
(74) *Attorney, Agent, or Firm* — Sughrue Mion, PLLC

(57) ABSTRACT

A radio-frequency integrated chip (RFIC) is described which provides a number of low noise amplifiers (LNAs) and load circuits. The low noise amplifiers are organized in groups. In some embodiments, a load circuit may be dedicated to a group or shared between groups. The RFIC includes an LNA group including a plurality of LNAs configured to amplify carrier signals related to a plurality of frequency bands, a second LNA group configured to amplify a plurality of second carrier signals, a first load circuit group dedicated to the first LNA group, a second load circuit group dedicated to the second LNA group, and a third load circuit group shared between the first LNA group and the second LNA group. In some embodiments the third load circuit group adaptively performs frequency down-conversion on a carrier signal amplified by at least one of the first LNA group and the second LNA group.

20 Claims, 20 Drawing Sheets

(56) References Cited

U.S. PATENT DOCUMENTS

| | | | |
|---|---|---|---|
| 9,525,503 B2 | 12/2016 | Narathong et al. | |
| 9,615,369 B2 | 4/2017 | Rangarajan et al. | |
| 9,859,930 B2 | 1/2018 | Lu | |
| 9,917,614 B1 | 3/2018 | Kang | |
| 9,948,363 B2 * | 4/2018 | Kahrizi | H04B 1/0067 |
| 10,250,195 B2 | 4/2019 | Kim et al. | |
| 2014/0269853 A1 * | 9/2014 | Gudem | H04B 7/02 |
| | | | 375/219 |
| 2017/0040947 A1 * | 2/2017 | Chang | H03F 1/0205 |

OTHER PUBLICATIONS

Mikhemar et al. "A Rel-12 2G/3G/LTE-Advanced 3CC Cellular Receiver", IEEE Journal of Solid-State Circuits, vol. 51, No. 5, May 2016, pp. 1066-1079, 14 pages total.

* cited by examiner

RADIO-FREQUENCY INTEGRATED CHIP CONFIGURED TO SUPPORT CARRIER AGGREGATION AND WIRELESS COMMUNICATION APPARATUS INCLUDING THE SAME

CROSS-REFERENCE TO THE RELATED APPLICATION

This application is based on and claims priority from Korean Patent Application No. 10-2019-0130185, filed on Oct. 18, 2019, in the Korean Intellectual Property Office, the disclosure of which is incorporated herein in its entirety by reference.

BACKGROUND

The inventive concept relates to wireless communication, and more particularly, to a radio-frequency integrated chip (RFIC) configured to support carrier aggregation (CA) and a wireless communication apparatus including the RFIC.

CA refers to a technique of using a plurality of carriers in the transmission and receiving of signals to and from one wireless communication apparatus. A frequency range of a data transmitted by one carrier may be referred to as a frequency channel, and the amount of data transmitted through a wireless channel may be increased due to CA that supports a plurality of frequency channels. With the recent development of communication technology, carriers used in CA may have various frequency ranges. To support the various frequency ranges of the carriers, configurations of receivers of a wireless communication apparatus or a configuration of an RFIC including the receivers may be complicated, and thus, there is a difficulty in miniaturizing the wireless communication apparatus.

Amplifiers are generally characterized by gain as a function of frequency. Other amplifier characteristics include noise figure, intermodulation performance (linearity), and power consumption.

SUMMARY

The inventive concept provides a connection structure between low-noise amplifiers (LNAs) and load circuits, which may efficiently support wide-band carrier aggregation (CA) and enable the miniaturization of a wireless communication apparatus.

Provided herein is an exemplary radio-frequency integrated chip (RFIC) including: a first low-noise amplifier (LNA) group, wherein the first LNA group includes a first plurality of LNAs, the first plurality of LNAs is configured to amplify a plurality of first carrier signals, and the plurality of first carrier signals correspond to at least a first one of a plurality of frequency bands; a second LNA group, wherein the second LNA group includes a second plurality of LNAs, the second plurality of LNAs is configured to amplify a plurality of second carrier signals, and the plurality of second carrier signals correspond to at least a second one of the plurality of frequency bands; a first load circuit group, wherein the first load circuit group is configured as dedicated to the first LNA group, the first load circuit group includes a first plurality of load circuits, wherein the first plurality of load circuits is configured to perform a frequency down-conversion of the plurality of first carrier signals amplified by the first LNA group; a second load circuit group, wherein the second load circuit group is configured as dedicated to the second LNA group, the second load circuit group includes a second plurality of load circuits, wherein the second plurality of load circuits is configured to perform a frequency down-conversion of the plurality of second carrier signals amplified by the second LNA group; and a third load circuit group, wherein the third load circuit group is configured as shared between the first LNA group and the second LNA group, the third load circuit group includes at least one third load circuit, the at least one third load circuit is configured to perform a frequency down-conversion of a third carrier signal, the third carrier signal amplified by either the first LNA group or the second LNA group.

Also provided herein is an exemplary wireless communication apparatus including: a first antenna; and a first receiver connected to the first antenna, wherein the first receiver includes: a plurality of first low-noise amplifier (LNA) groups, wherein each LNA group of the plurality of first LNA groups includes a first plurality of LNAs, wherein the first plurality of LNAs is configured to amplify a first plurality of carrier signals corresponding to at least a first one of a plurality of frequency bands; a plurality of first dedicated load circuit groups respectively configured as allocated to the plurality of first LNA groups in a one-to-one manner, each dedicated load circuit group of the plurality of first dedicated load circuit groups including a plurality of load circuits, each of the first dedicated load circuit groups is configured to perform a frequency down-conversion of the first plurality of carrier signals amplified by the first plurality of LNAs of each of the first LNA groups; and a first shared load circuit group, wherein the first shared load circuit group is configured as shared among the plurality of first LNA groups, the first shared load circuit group including at least one load circuit configured to perform frequency down-conversion on the first plurality of carrier signals amplified by at least one of the first plurality of LNAs.

In addition, provided herein is an exemplary wireless communication apparatus including: a plurality of antennas; a plurality of receivers respectively connected to the plurality of antennas; and a baseband processor configured to control the plurality of receivers, wherein each of the plurality of receivers includes: a plurality of low-noise amplifier (LNA) groups, each LNA group of the plurality of LNA groups including a plurality of LNAs, the plurality of LNAs configured to amplify a plurality of carrier signals, the plurality of carrier signals corresponding to at least one of a plurality of frequency bands; a plurality of dedicated load circuit groups respectively allocated to the plurality of LNA groups in a one-to-one manner, each dedicated load circuit group of the plurality of dedicated load circuit groups including a plurality of load circuits, each plurality of the load circuits configured to perform a frequency down-conversion of the plurality of carrier signals; and a shared load circuit group configured as shared among the plurality of LNA groups, the shared load circuit group including at least one load circuit, the at least one load circuit configured to perform a frequency down-conversion of a first carrier signal amplified by at least one LNA of the plurality of LNAs, wherein the baseband processor is further configured to allocate the at least one load circuit to at least one of the plurality of LNA groups, based on control information.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
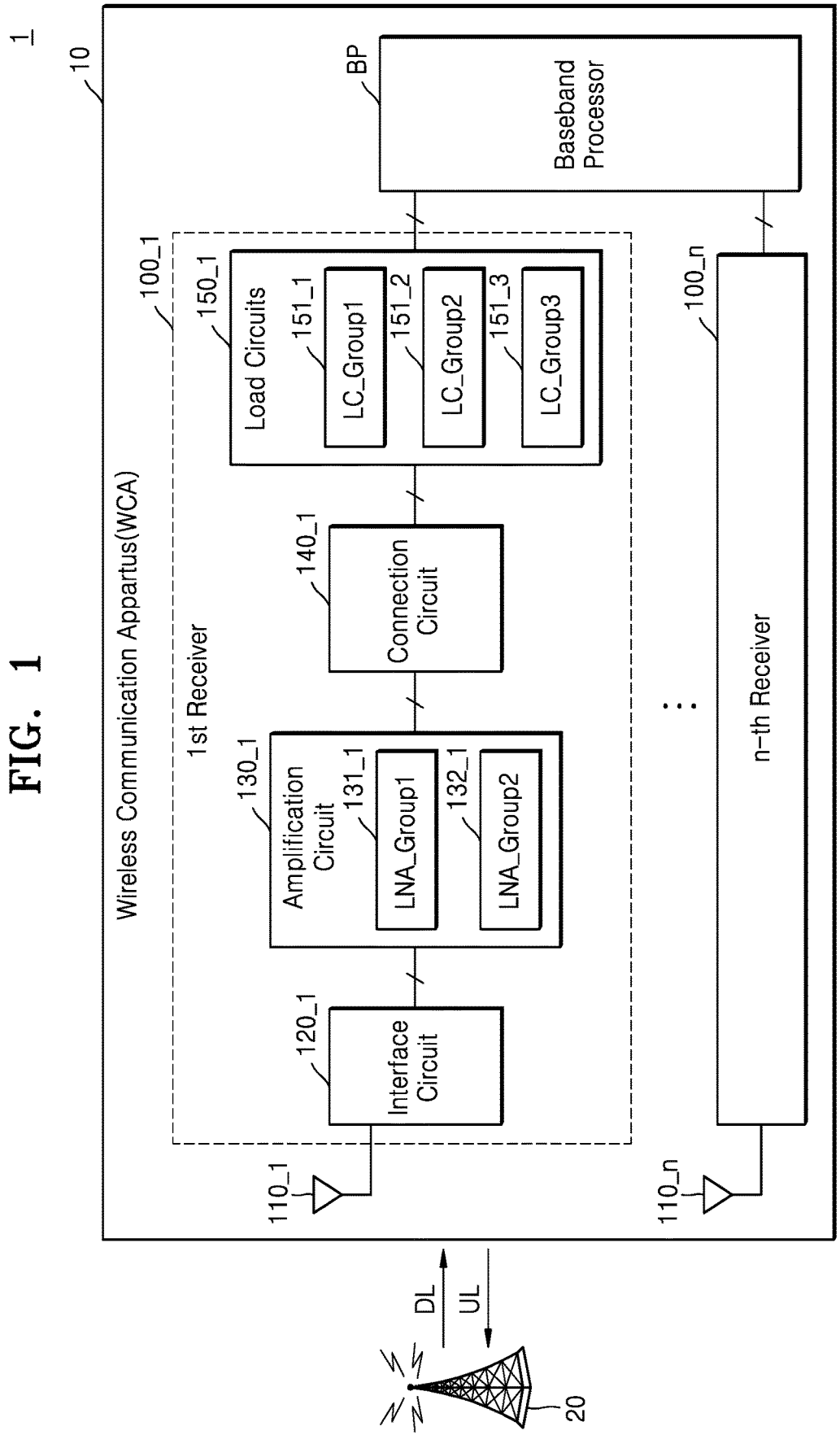
FIG. 1 is a schematic block diagram of a wireless communication system including a wireless communication apparatus and a base station, according to an example embodiment.

FIG. 1 is a schematic block diagram of a wireless communication system 1 including a wireless communication apparatus 10 and a base station 20, according to an example embodiment.

Referring to FIG. 1, the wireless communication apparatus 10 may communicate with the base station 20 through a downlink (DL) and an uplink (UL). In an example, the wireless communication system 1 may include a long-term evolution (LTE) system, a code division multiple access (CDMA) system, a global system for mobile communications (GSM) system, wireless local area network (WLAN), or another wireless communication system. The wireless communication apparatus 10 may be stationary or mobile and refer to various pieces of equipment capable of communicating with the base station 20 and transmitting and receiving data and/or control information. For example, the wireless communication apparatus 10 may be referred to as user equipment, terminal equipment, a mobile station (MS), a mobile terminal (MT), a user terminal (UT), a subscriber station (SS), a wireless device, a handheld device, or the like. The base station 20 may typically refer to a stationary station configured to communicate with a wireless communication apparatus and/or another base station. The base station 20 may communicate with the wireless communication apparatus and/or another base station and exchange data and/or control information. For example, the base station 20 may be referred to as Node B, evolved-Node B (eNB), a base transceiver system (BTS), an access point (AP), or the like.

A wireless communication network between the wireless communication apparatus 10 and the base station 20 may share available network resources and support the communication of a plurality of users. For example, in the wireless communication network, information may be transmitted using various methods, such as code division multiple access (CDMA), frequency division multiple access (FDMA), time division multiple access (TDMA), orthogonal frequency division multiple access (OFDMA), and single carrier frequency division multiple access (SC-FDMA).

The wireless communication system 1 may support carrier aggregation (CA) using a plurality of carriers. That is, the wireless communication apparatus 10 and the base station 20 may transmit and receive data using a plurality of carriers simultaneously. In CA, a carrier used by the wireless communication apparatus 10 and the base station 20 may be referred to as a component carrier, and a frequency range transmitted by one component carrier may be referred to as a frequency channel. The frequency channel may be included in a frequency band, and the frequency band may include a plurality of contiguous frequency channels. For example, in LTE, a frequency channel covered by one component carrier may have a width of 20 MHz, and one frequency band may cover up to 200 MHz. As described below with reference to FIGS. 2A to 2C, the wireless communication apparatus 10 and the base station 20 may use various frequency channels for CA.

The wireless communication apparatus 10 (or the base station 20) may include a structure configured to appropriately process signals received through various frequency channels. For example, the wireless communication apparatus 10 may include a plurality of receivers (e.g., first to n-th receivers 100_1 to 100_n) configured to separate the frequency channels from each other. Also, the first to n-th receivers 100_1 to 100_n may also support non-CA transmission, namely, the processing of signals using one carrier. As shown in FIG. 1, the wireless communication apparatus 10 may include a plurality of antennas (e.g., first to n-th antennas 110_1 to 110_n_, of the first to n-th receivers 100_1 to 100_n, and a baseband processor BP. Hereinafter, a signal transmitted and received through a predetermined carrier may be referred to as a carrier signal. In some embodiments, the first to n-th receivers 100_1 to 100_n may be implemented as one radio-frequency integrated chip (RFIC). Hereinafter, a structure of the first receiver 100_1 according to an example embodiment will mainly be described, and the configuration of the first receiver 100_1 may be applied to the other receivers 100_2 to 100_n. Also, a receiver may be implemented as a transceiver that may transmit a carrier signal, and an RFIC may be implemented as an integrated circuit (IC).

The first receiver 100_1 may include an interface circuit 120_1, an amplification circuit 130_1, a connection circuit 140_1, and load circuits 150_1 and be connected to the first antenna 110_1. The interface circuit 120_1 may include a plurality of switch elements (not shown) and a plurality of duplexers (not shown), which transmit and receive radio-frequency (RF) signals through the first antenna 110_1. The interface circuit 120_1 may further include filters (not shown), which filter RF signals received through the first antenna 110_1 and output a plurality of carrier signals, which are divided according to frequency channels, to the amplification circuit 130_1. Also, the interface circuit 120_1 may further include matching circuits (not shown) configured to perform impedance matching between switch elements/duplexers and the amplification circuit 130_1.

The amplification circuit 130_1 may include a plurality of low-noise amplifiers (LNAs) configured to amplify a plurality of carrier signals. The amplification circuit 130_1 may include a first LNA group 131_1 and a second LNA group 132_1. That is, the plurality of LNAs may be grouped into the first LNA group 131_1 and the second LNA group 132_1. Criteria for grouping the plurality of LNAs into the first LNA group 131_1 and the second LNA group 132_1 may vary.

In an example embodiment, the LNAs of the first LNA group 131_1 may include first LNAs configured to support CA and second LNAs configured to support receive diversity (RXD) (or multiple input and multiple output (MIMO)). The LNAs of the second LNA group 132_1 may include third LNAs configured to support CA and fourth LNAs configured to support RXD (or MIMO). Here, an LNA configured to support CA may refer to an LNA having a predetermined connection relationship with the interface circuit 120_1 to receive and amplify a carrier signal that is scheduled for CA-based communication. In addition, an LNA configured to support RXD (or MIMO) may refer to an LNA having a predetermined connection relationship with the interface circuit 120_1 to receive and amplify a carrier signal that is scheduled for RXD (or MIMO)-based communication. Furthermore, a frequency band that is coverable by the first LNAs may be different from a frequency band that is coverable by the third LNAs, and a frequency band that is coverable by the second LNAs may be different from a frequency band that is coverable by the fourth LNAs. Here, a coverable frequency band may refer to a frequency range of carrier signals that may be received by each of the first to fourth LNAs due to a connection relationship (or connection structure) between the interface circuit 120_1 and the first and second LNA groups 131_1 and 132_1. For example, when a plurality of frequency bands include a low band, a mid band, and a high band, the frequency band that is coverable by the first LNAs may include the low band and the mid band, the frequency band that is coverable by the second LNAs may include the high band, the frequency band that is coverable by the third LNAs may include the high band, and the frequency band that is coverable by the fourth LNAs may include the mid band. However, the inventive concept not limited to the present example embodiment, and the frequency band that is coverable by each of the first to fourth LNAs may be variously implemented.

In another embodiment, the LNAs of the first LNA group 131_1 may include first LNAs configured to support CA, and the LNAs of the second LNA group 132_1 may include second LNAs configured to support RXD (or MIMO). The frequency band that is coverable by the first LNAs may be equal to the frequency band that is coverable by the second LNAs.

In addition, various grouping criteria may be applied to the first LNA group 131_1 and the second LNA group 132_2 to efficiently support CA in wide frequency bands and enable the miniaturization of the amplification circuit 130_1.

The connection circuit 140_1 may include a plurality of interconnection lines configured to connect the amplification circuit 130_1 and the load circuits 150_1 and/or a plurality of switch elements. Hereinafter, it is assumed that the amplification circuit 130_1 is connected to the load circuits 150_1 through the connection circuit 140_1. The baseband processor BP may control the connection circuit 140_1 and adaptively control a connection relationship between the amplification circuit 130_1 and the load circuits 150_1. This will be described in detail below.

The load circuits 150_1 may perform frequency down-conversion on carrier signals, which are amplified by the amplification circuit 130_1. The load circuits 150_1 may include first to third load circuit groups 151_1 to 153_1. The load circuits 150_1 may generate baseband signals due to the frequency down-conversion and output the baseband signals to the baseband processor BP.

In an example embodiment, the first load circuit group 151_1 may include a plurality of load circuits configured to perform frequency down-conversion on carrier signals amplified by the first LNA group 131_1. That is, the first load circuit group 151_1 may be allocated and dedicated to the first LNA group 131_1 in a one-to-one manner. The second load circuit group 152_1 may include a plurality of load circuits configured to perform frequency down-conversion on carrier signals amplified by the second LNA group 132_1. That is, the second load circuit group 152_1 may be allocated and dedicated to the second LNA group 132_1 in a one-to-one manner. The third load circuit group 151_3 may be shared between the first LNA group 131_1 and the second LNA group 132_1 and perform frequency down-conversion on a carrier signal that is amplified by at least one of the first LNA group 131_1 and the second LNA group 132_2. Detailed connection structures between the third load circuit group 151_3 and the first and second LNA groups 131_1 and 132_1 will be described below.

The baseband processor BP may perform a processing operation (e.g., a sampling operation, a demodulation operation, or a decoding operation) on baseband signals received by the first to n-th receivers 100_1 to 100_n and detect data transmitted by the base station 20. Meanwhile, the baseband processor BP may control an internal connection relationship of the first to n-th receivers 100_1 to 100_n according to a preset communication method. In an example, the baseband processor BP may previously obtain predetermined control information indicating the preset communication method from the base station 20 and control the internal connection relationship of the first to n-th receivers 100_1 to 100_n based on the control information. The control information may include at least one of information about CA (or information about a CA-based communication method, information about RXD, and information about MIMO). For example, the base station 20 may preset carriers used to transmit signals, and the baseband processor BP may previously obtain control information including information about the scheduling of the preset carriers from the base station 20 and control an internal connection relationship among the first to n-th receivers 100_1 to 100_n based on the set carriers. The baseband processor BP may control a connection relationship among the first antenna 110_1, the amplification circuit 130_1, and the load circuits 150_1 of the first receiver 100_1 by using the interface circuit 120_1 and the connection circuit 140_1.

The wireless communication apparatus 10 according to the example embodiment may group LNAs configured to low-noise amplify carrier signals and allocate dedicated load circuits to respective LNA groups and then adaptively allocate at least one load circuit to an LNA group based on a communication method and a communication environment. Thus, the total number of LNAs may be reduced, and furthermore, the design complexity of receivers may be reduced.

Figure 2A:
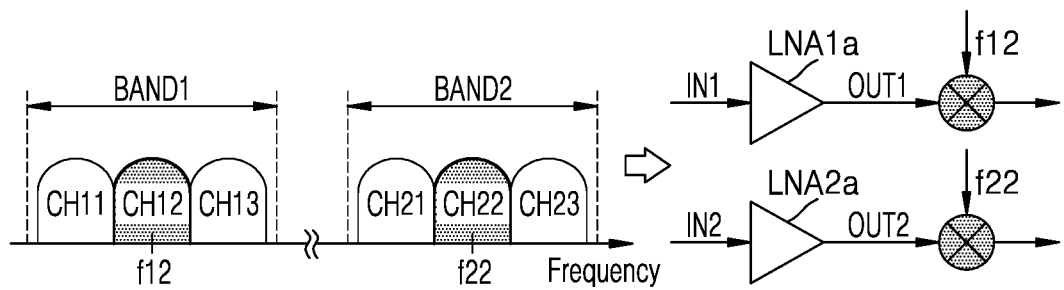
FIGS. 2A to 2C show exemplary types of carrier aggregation (CA) and exemplary structures configured to extract carrier signals from frequency channels corresponding to the exemplary types of CA.
Figure 2B:
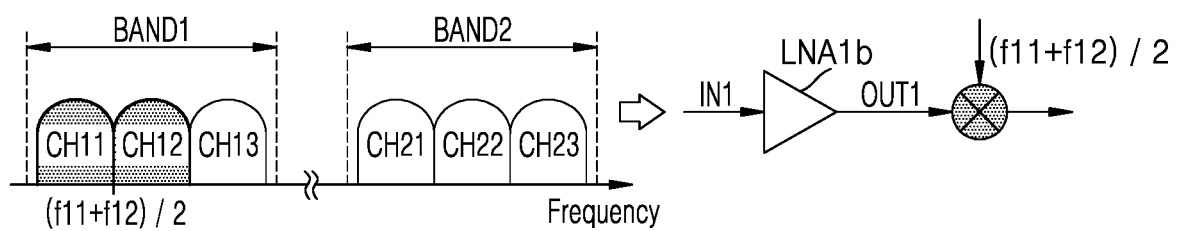
Figure 2C:
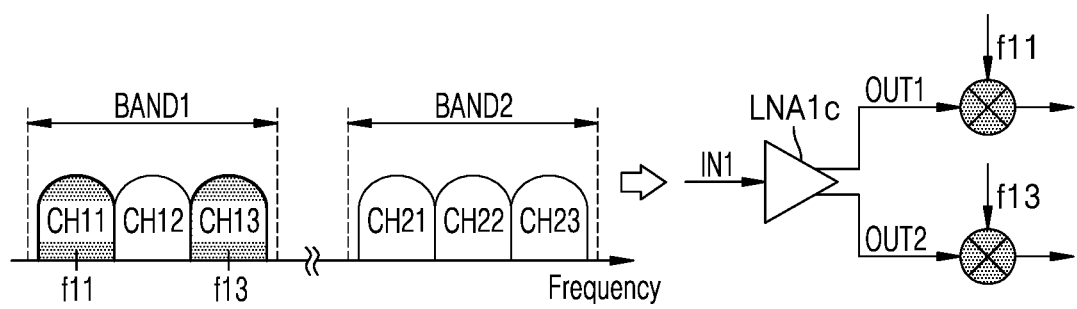

FIGS. 2A to 2C show exemplary types of CA and exemplary structures configured to extract carrier signals from frequency channels corresponding to the exemplary types of CA. For example, FIG. 2A shows an example of inter-band CA, FIG. 2B shows an example of contiguous intra-band CA, and FIG. 2C shows an example of non-contiguous intra-band CA. In the examples shown in FIGS. 2A to 2C, it is assumed that two frequency bands BAND1 and BAND2 may be used for the transmission of data, and one frequency band may have three frequency channels (or three carriers). However, the inventive concept is not limited to the present example embodiment, and one frequency band may have more than three frequency channels.

Referring to FIG. 2A, in inter-band CA, frequency channels in use may be respectively disposed in different frequency bands. For example, as shown in FIG. 2A, frequency channels CH12 and CH22 in use may be respectively included in first and second frequency bands BAND1 and BAND2, and thus, spaced relatively far apart from each other. Two LNAs LNA1a and LNA2a may respectively amplify first and second carrier signals IN1 and IN2 and output first and second output signals (or first and second amplified carrier signals) OUT1 and OUT2. The first and second output signals OUT1 and OUT2 may be respectively down-converted by frequencies f12 and f22 corresponding respectively to the frequency channels CH12 and CH22 and converted into baseband signals.

Referring to FIG. 2B, in contiguous intra-band CA, frequency channels in use may be contiguously arranged in the same frequency band. For example, as shown in FIG. 2B, frequency channels CH11 and CH12 in use may be included in a first frequency band BAND1 and adjacent to each other. An LNA LNA1b may amplify a first carrier signal IN1 and output a first output signal OUT1, and the first output signal OUT1 may be down-converted by an intermediate frequency (i.e., (f11+f12)/2) between frequencies f11 and f12 corresponding to the frequency channels CH11 and CH12 in use.

Referring to FIG. 2C, in non-contiguous intra-band CA, frequency channels in use may be non-contiguously (or separately) arranged in the same frequency band. For example, as shown in FIG. 2C, frequency channels CH11 and CH13 in use may be included in a first frequency band BAND1 and spaced apart from each other. In an example, to separate the frequency channels CH11 and CH13 that are in use in the non-contiguous intra-band CA, as shown in FIG. 2C, an LNA LNA1c may output two output signals (i.e., first and second output signals OUT1 and OUT2) from a first carrier signal IN1, and the first and second output signals OUT1 and OUT2 may be down-converted by frequencies f11 and f13 corresponding respectively to the frequency channels CH11 and CH13.

Figure 3A:
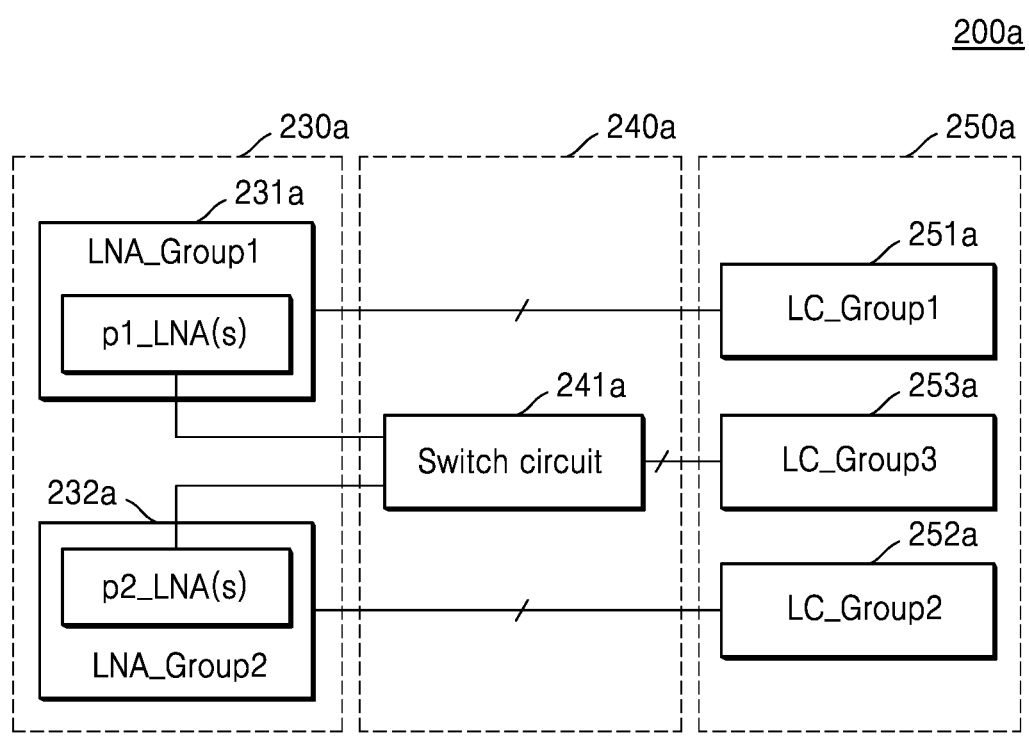
FIG. 3A is a schematic diagram of a receiver according to an example embodiment.
Figure 3B:
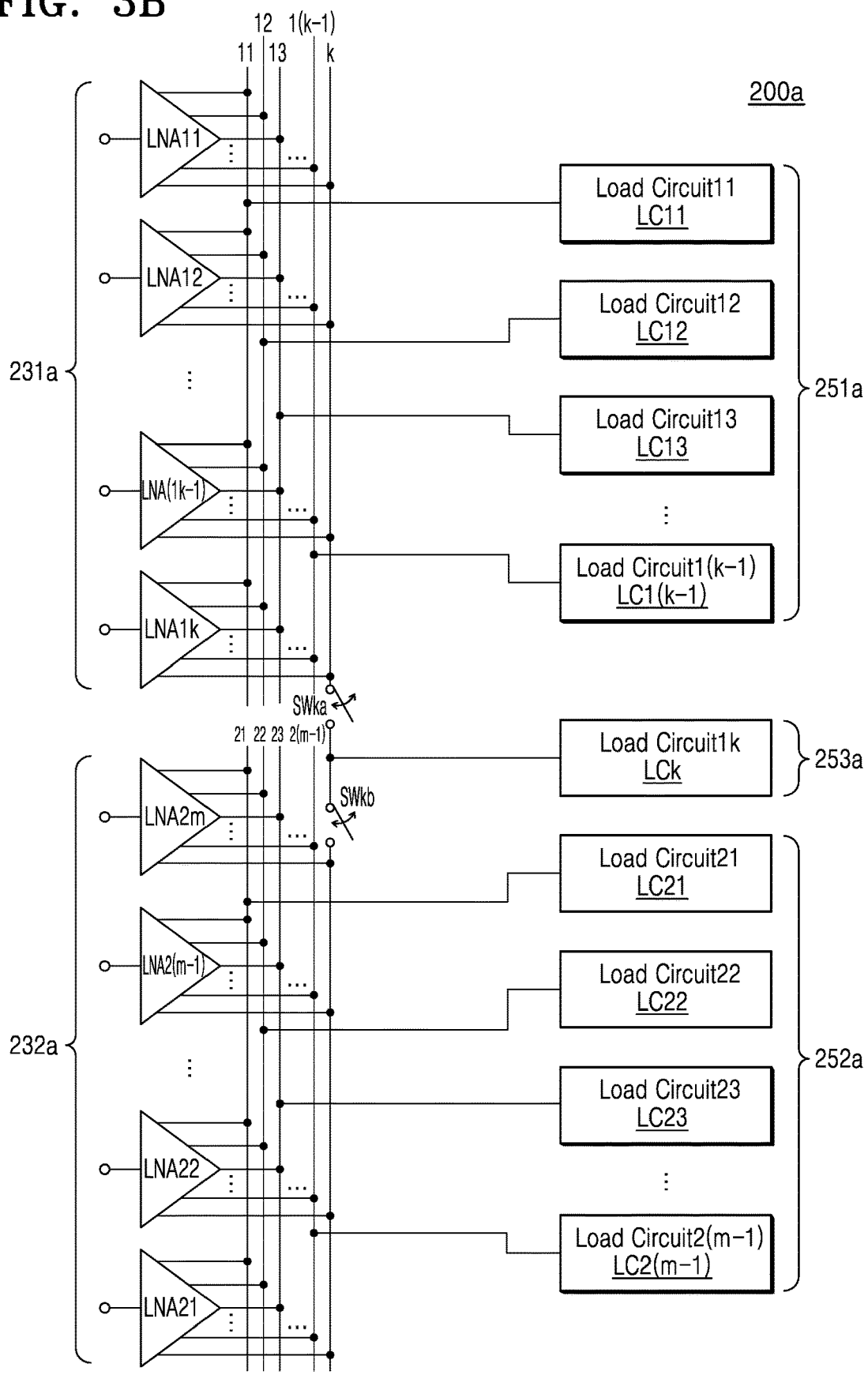
FIG. 3B is a diagram of a specific internal connection relationship of the receiver of FIG. 3A.
Figure 3C:
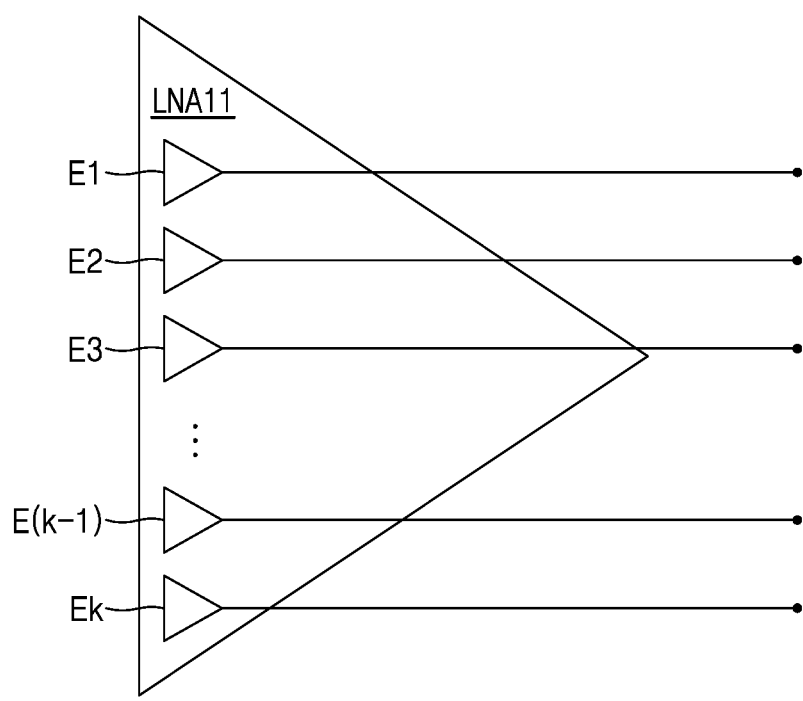
FIG. 3C is a diagram of a specific configuration of a low-noise amplifier (LNA) of FIG. 3B.

FIG. 3A is a schematic diagram of a receiver 200a according to an example embodiment. FIG. 3B is a diagram of a specific internal connection relationship of the receiver 200a of FIG. 3A. FIG. 3C is a diagram of a specific configuration of an LNA LNA11 of FIG. 3B.

Referring to FIG. 3A, the receiver 200a may include an amplification circuit 230a, a connection circuit 240a, and load circuits 250a. The amplification circuit 230a may include a first LNA group 231a and a second LNA group 232a. The load circuits 250a may include first to third load circuit groups 251a to 253a. In an example embodiment, communication methods that may be supported by the first LNA group 231a may be of the same types as communication methods that may be supported by the second LNA group 232a. Also, frequency bands that are coverable by the first LNA group 231a and the second LNA group 232a may differ according to a communication method that may be supported by the first LNA group 231a and the second LNA group 232a. For example, LNAs of the first LNA group 231a may include first LNAs configured to support CA and second LNAs configured to support RXD (or MIMO).

As used herein, the expression "a frequency band that is coverable by an LNA" includes a frequency band for which the LNA provides acceptable gain.

LNAs of the second LNA group 232a may include third LNAs configured to support CA and fourth LNAs configured to support RXD (or MIMO). Meanwhile, a frequency band that is coverable by the first LNAs may be different from a frequency band that is coverable by the third LNAs, and a frequency band that is coverable by the second LNAs may be different from a frequency band that is coverable by the fourth LNAs.

In another embodiment, communication methods that may be supported by the first LNA group 231a may be of different types from communication methods that may be supported by the second LNA group 232a. For example, the LNAs of the first LNA group 231a may include first LNAs configured to support CA, and the LNAs of the second LNA group 232a may include second LNAs configured to support RXD (or MIMO). In this case, a frequency band that is coverable by the first LNAs may be the same as a frequency band that is coverable by the second LNAs.

The first load circuit group 251a may be connected to the first LNA group 231a, and load circuits included in the first load circuit group 251a may perform frequency down-conversion on signals output by the first LNA group 231a. The first load circuit group 251a, which is dedicated to the first LNA group 231a, may be referred to as a first dedicated load circuit group.

The second load circuit group 252a may be connected to the second LNA group 232a, and load circuits included in the second load circuit group 252a may perform frequency down-conversion on signals output by the second LNA group 232a. The second load circuit group 252a, which is dedicated to the second LNA group 232a, may be referred to as a second dedicated load circuit group.

The third load circuit group 253a may be shared between the first LNA group 231a and the second LNA group 232a and adaptively perform frequency down-conversion on signals output by at least one of the first LNA group 231a and the second LNA group 232a. At least one LNA p1_LNA(s) of the first LNA group 231a and at least one LNA p2_LNA(s) of the second LNA group 232a may be selectively connected to the third load circuit group 253a through a switch circuit 241a of the connection circuit 240a. For example, when the additional allocation of load circuits to the first LNA group 231a is required considering a communication method and a communication environment, at least one LNA(p1_LNA(s)) of the first LNA group 231a may be connected to the third load circuit group 253a through the switch circuit 241a, and all LNA(p2_LNA(s)s of the second LNA group 232a should be disconnected from the third load circuit group 253a by the switch circuit 241a. Also, when the additional allocation of load circuits to the second LNA group 232a is required considering a communication method and a communication environment, at least one LNA p2_LNA(s) of the second LNA group 232a may be connected to the third load circuit group 253a through the switch circuit 241a, and all LNA p1_LNA(s)s of the first LNA group 231a should be disconnected from the third load circuit group 253a by the switch circuit 241a.

The connection circuit 240a may include a plurality of interconnection lines configured to connect the first LNA group 231a to the first load circuit group 251a, a plurality of interconnection lines configured to connect the second LNA group 232a to the second load circuit group 252a, a plurality of interconnection lines configured to connect some LNAs p1_LNA(s) and p2_LNA(s) of the first and second LNA groups 231a and 232a and the third load circuit group 253a, and the switch circuit 241a. Meanwhile, on/off operations of a plurality of switch elements included in the switch circuit 241a of the connection circuit 240a may be controlled by the baseband processor BP of FIG. 1.

Referring to FIG. 3B, the first LNA group 231a may include k LNAs LNA11 to LNA1k (here, k is an integer equal to or more than 1), and the second LNA group 232a may include m LNAs LNA21 to LNA2m (here, m is an integer equal to or more than 1). The first load circuit group 251a may include (k−1) load circuits LC11 to LC1(k−1), and the second load circuit group 252a may include (m−1) load circuits LC21 to LC2(m−1). The third load circuit group 253a may include one load circuit LCk. The total number of load circuits included in the first to third load circuit groups 251a to 253a may correspond to the maximum number of available carriers of a wireless communication apparatus including the receiver 200a.

Each of the LNAs LNA11 to LNA1k of the first LNA group 231a may include k output terminals and be connected to the load circuits LC11 to LC1(k−1) of the first load circuit group 251a through (k−1) interconnection lines 11 to 1(k−1). Meanwhile, the LNAs LNA11 to LNA1k of the first LNA group 231a may be selectively connected to the load circuit LCk of the third load circuit group 253a through a k-th interconnection line k and a first switch element SWka. However, in some embodiments, each of some of the LNAs LNA11 to LNA1k of the first LNA group 231a may include fewer than k output terminals, and the some LNAs may not be connected to the load circuit LCk of the third load circuit group 253a.

Each of the LNAs LNA21 to LNA2m of the second LNA group 232a may include m output terminals and be connected to the load circuits LC21 to LC2(m−1) of the second load circuit group 252a through (m−1) interconnection lines 21 to 2(m−1). Meanwhile, the LNAs LNA21 to LNA2m of the second LNA group 232a may be selectively connected to the load circuit LCk of the third load circuit group 253a through the k-th interconnection line k and a second switch element SWkb. However, in some embodiments, each of some of the LNAs LNA21 to LNA2m of the second LNA group 232a may include fewer than m output terminals, and the some LNAs may not be connected to the load circuit LCk of the third load circuit group 253a.

In the structure shown in FIG. 3B, by controlling on/off operations of the first and second switch elements SWka and SWkb based on a communication method and a communication environment, the load circuit LCk may be additionally allocated to any one of the LNAs LNA11 to LNA1k of the first LNA group 231a or the load circuit LCk may be additionally allocated to any one of the LNAs LNA21 to LNA2m of the second LNA group 232a.

Although a configuration of the receiver 200a shown in FIG. 3B is merely an example embodiment, the inventive concept is not limited thereto. The third load circuit group 253a may include a larger number of load circuits than in FIG. 3B, and the receiver 200a may include a larger number of switch elements than in FIG. 3B. Thus, the number of allocated load circuits may be flexibly increased, based on a communication method and a communication environment, and more flexible communication support may be provided.

Referring to FIG. 3C, an LNA (e.g., a first LNA LNA11) of the first group 231a shown in FIG. 3B may include LNA elements E1 to Ek in equal number to the number of output terminals of the first LNA LNA11 (or the number of connected interconnection lines). In an example, the first LNA LNA11 of the first LNA group 231a may include k LNA elements E1 to Ek, and the LNA elements E1 to Ek may be respectively connected to k interconnection lines 11 to k of FIG. 3B.

Input lines of the LNA elements E1 to Ek may join at a common input node to provide the single input to LNA11 shown in FIG. 3B.

Meanwhile, an LNA of the second LNA group 232a may include m LNA elements, and the m LNA elements may be respectively connected to m interconnection lines 21 to 2(m−1) and k. In an example embodiment, the LNA elements E1 to Ek may respectively amplify carrier signals corresponding to different frequency channels.

However, the inventive concept is not limited to the above-described example embodiment, and the number of LNA elements included in some of LNAs included in the same LNA group may be different from the number of LNA elements included in some others thereof.

Figure 4A:
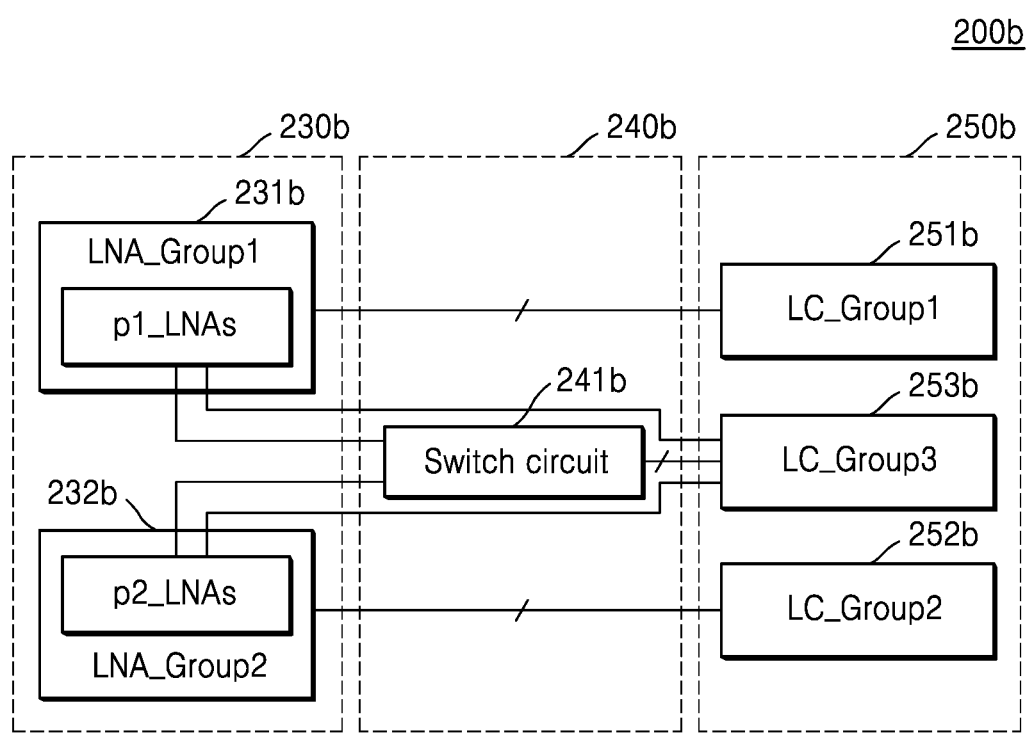
FIG. 4A is a schematic diagram of a receiver according to an example embodiment.
Figure 4B:
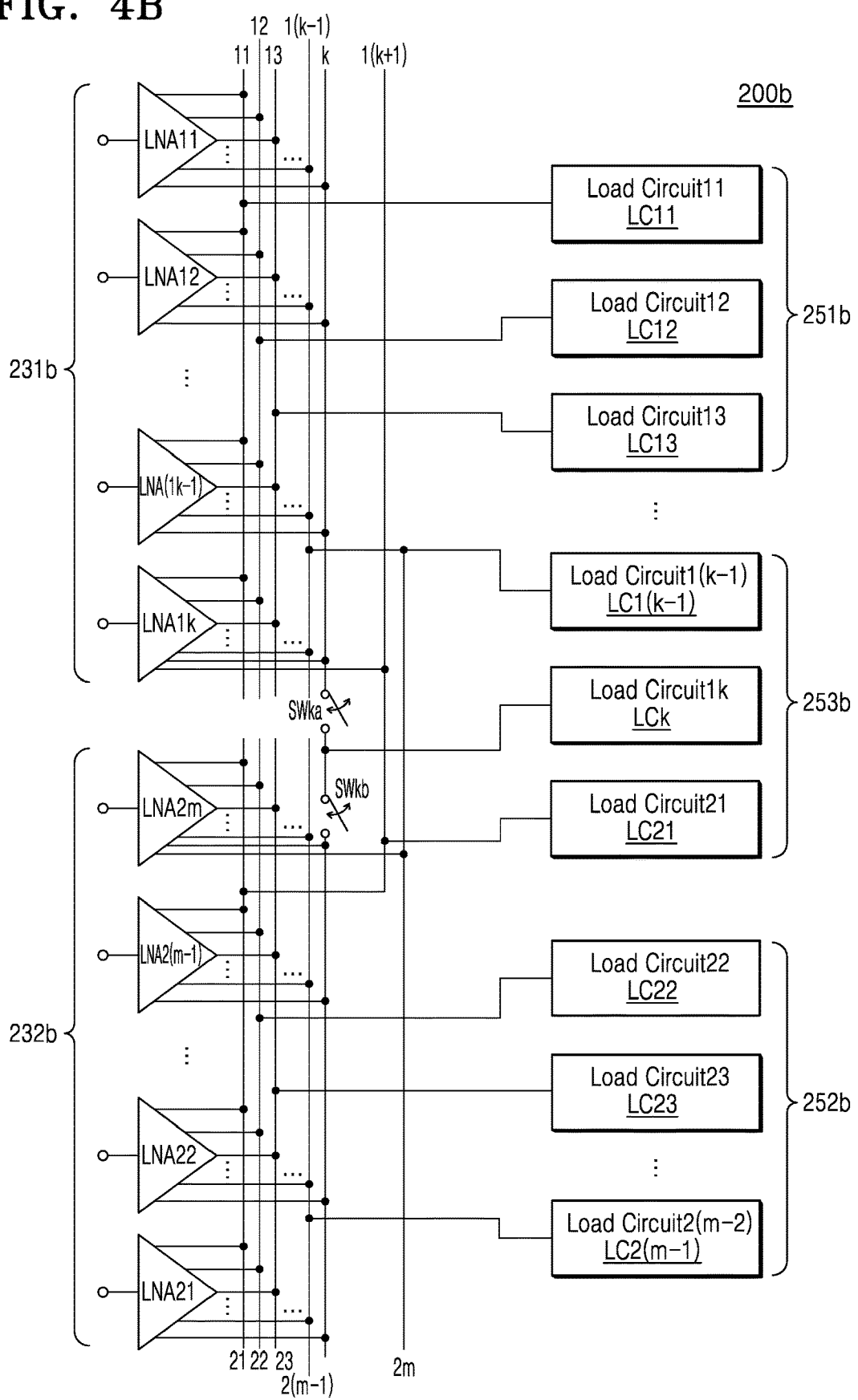
FIG. 4B is a diagram of a specific internal connection relationship of the receiver of FIG. 4A.

FIG. 4A is a schematic diagram of a receiver 200b according to an example embodiment. FIG. 4B is a diagram of a specific internal connection relationship of the receiver 200b of FIG. 4A.

Referring to FIG. 4A, the receiver 200b may include an amplification circuit 230b, a connection circuit 240b, and load circuits 250b. The amplification circuit 230b may include a first LNA group 231b and a second LNA group 232b. The load circuits 250b may include first to third load circuit groups 251b to 253b. Since the criteria for grouping the first and second LNA groups 231b and 232b are described in detail with reference to FIGS. 1 and 3A, a description thereof will be omitted.

The first load circuit group 251b may be connected to the first LNA group 231b, and load circuits included in the first load circuit group 251b may perform frequency down-conversion on signals output by the first LNA group 231b. The first load circuit group 251b, which is dedicated to the first LNA group 231b, may be referred to as a first dedicated load circuit group.

The second load circuit group 252b may be connected to the second LNA group 232b, and load circuits included in the second load circuit group 252b may perform frequency down-conversion on signals output by the second LNA group 232b. The second load circuit group 252b, which is dedicated to the second LNA group 232b, may be referred to as a second dedicated load circuit group.

The third load circuit group 253b may be shared between the first LNA group 231b and the second LNA group 232b and adaptively perform frequency down-conversion on signals output by at least one of the first LNA group 231b and the second LNA group 232b. For example, some of LNAs p1_LNAs of the first LNA group 231b may be directly connected to at least one load circuit of the third load circuit group 253b through at least one interconnection line, and some others of the LNAs p1_LNAs may be selectively connected to at least one load circuit of the third load circuit group 253b through a switch circuit 241b. Some of LNAs p2_LNAs of the second LNA group 232b may be directly connected to at least one load circuit of the third load circuit group 253b through at least one interconnection line, and some others of the LNAs p2_LNAs may be selectively connected to at least one load circuit of the third load circuit group 253b through the switch circuit 241b.

The connection circuit 240b may include a plurality of interconnection lines configured to connect the first LNA group 231b to the first load circuit group 251b, a plurality of interconnection lines configured to connect the second LNA group 232b to the second load circuit group 252b, a plurality of interconnection lines configured to directly connect some of the LNAs p1_LNAs and p2_LNAs of the first and second LNA groups 231b and 232b to the third load circuit group 253b, a plurality of interconnection lines configured to connect some others of the LNAs p1_LNAs and p2_LNAs to the third load circuit group 253b, and the switching circuit 241b. Meanwhile, on/off operations of a plurality of switch elements included in the switch circuit 241b of the connection circuit 240b may be controlled by the baseband processor BP of FIG. 1.

Referring to FIG. 4B, the first LNA group 231b may include k LNAs LNA11 to LNA1k, and the second LNA group 232b may include m LNAs LNA21 to LNA2m. The first load circuit group 251b may include (k−2) load circuits LC11 to LC1(k−2), and the second load circuit group 252b may include (m−2) load circuits LC22 to LC2(m−1). Also, the third load circuit group 253b may include three load circuits LC1(k−1), LCk, and LC21.

Each of some LNAs (e.g., first to (k−1)-th LNAs LNA11 to LNA1(k−1) of the first LNA group 231b may include k output terminals, and the remaining LNA (e.g., a k-th LNA LNA1k may include (k+1) output terminals. The LNAs LNA11 to LNA1k of the first LNA group 231b may be respectively connected to the load circuits LC11 to LC1(k−2) of the first load circuit group 251b through (k−2) interconnection lines 11 to 1(k−2). The LNAs LNA11 to LNA1k may be selectively connected to the load circuit LCk of the third load circuit group 253b through a k-th interconnection line k and a first switch element SWka and connected to the load circuit LC1(k−1) of the third load circuit group 253b through a k-1-th interconnection line 1(k−1). Also, the k-th LNA LNA1k may be connected to the load circuit LC21 of the third load circuit group 253b through a k+1-th interconnection line 1(k+1).

Each of some LNAs (e.g., first to (m−1)-th LNAs LNA21 to LNA2(m−1)) of the second LNA group 232b may include m output terminals, and the remaining LNA (e.g., the m-th LNA LNA2m) may include (m+1) output terminals. The LNAs LNA21 to LNA2m of the second LNA group 232b may be respectively connected to the load circuits LC22 to LC2(m−1) of the second load circuit group 252b through (m−2) interconnection lines 22 to 2(m−1). The LNAs LNA21 to LNA2m may be selectively connected to the load circuit LCk of the third load circuit group 253b through the k-th interconnection line k and a second switch element SWkb, and connected to the load circuit LC21 of the third load circuit group 253b through a first interconnection line 21. Also, the m-th LNA LNA2m may be connected to the load circuit LC1(k−1) of the third load circuit group 253b through an m-th interconnection line 2m.

In the structure shown in FIG. 4B, by controlling on/off operations of the first and second switch elements SWka and SWkb based on a communication method and a communication environment, the load circuit LCk may be additionally allocated to any one of the LNAs LNA11 to LNA1k of the first LNA group 231b, or the load circuit LCk may be additionally allocated to any one of the LNAs LNA21 to LNA2m of the second LNA group 232b. Furthermore, when the load circuit LC1(k−1) is additionally allocated to the m-th LNA LNA2m of the second LNA group 232b, output terminals of the LNAs LNA11 to LNA1k of the first LNA group 231b, which are connected to the load circuit LC1(k−1), or LNA elements corresponding to the output terminals may be deactivated to disable the load circuit LC1(k−1). Also, when the load circuit LC21 is additionally allocated to the k-th LNA LNA1k of the first LNA group 231b, output terminals of the LNAs LNA21 to LNA2m of the second LNA group 232b, which are connected to the load circuit LC21, or LNA elements corresponding to the output terminals may be deactivated to disable the load circuit LC21.

Since a configuration of the receiver 200b shown in FIG. 4B is merely an example embodiment, the inventive concept is not limited thereto and may be applied to various embodiments.

Figure 5A:
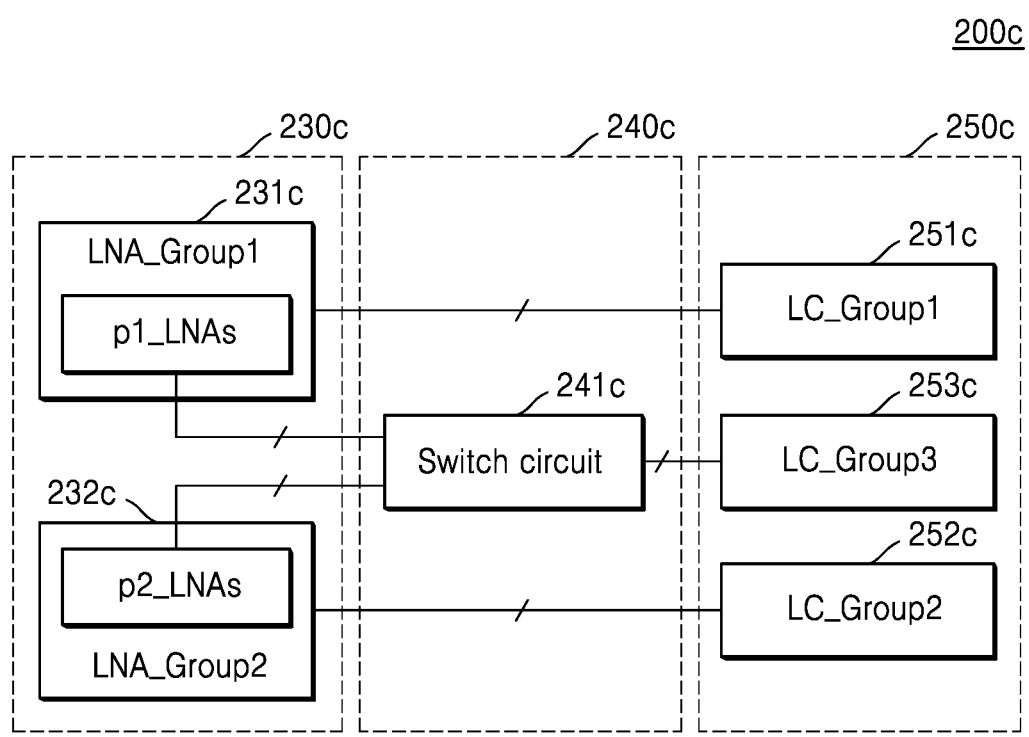
FIG. 5A is a schematic diagram of a receiver according to an example embodiment.
Figure 5B:
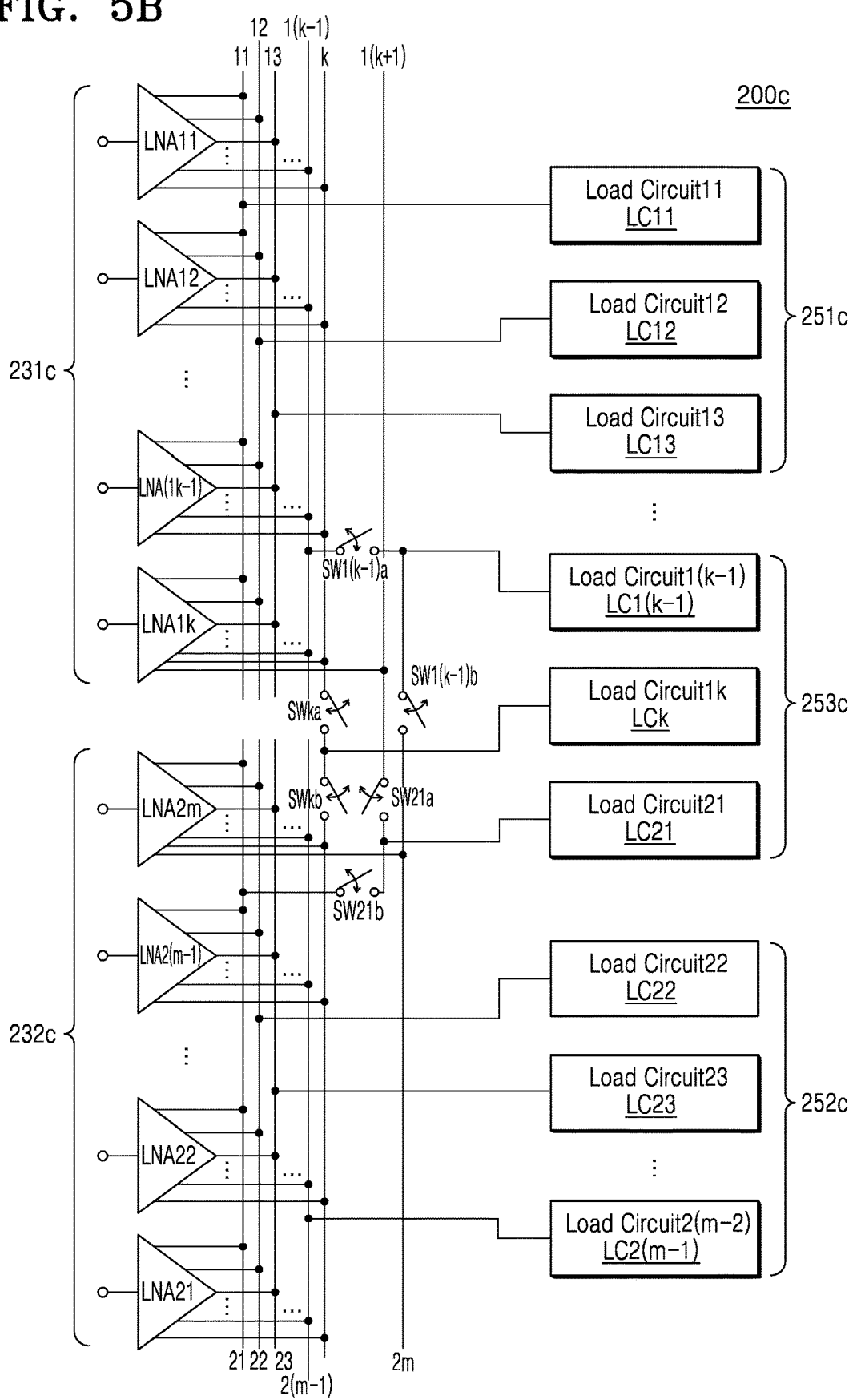
FIG. 5B is a diagram of a specific internal connection relationship of the receiver of FIG. 5A.

FIG. 5A is a schematic diagram of a receiver 200c according to an example embodiment. FIG. 5B is a diagram of a specific internal connection relationship of the receiver 200c of FIG. 5A.

Referring to FIG. 5A, the receiver 200c may include an amplification circuit 230c, a connection circuit 240c, and load circuits 250c. The amplification circuit 230c may include a first LNA group 231c and a second LNA group 232c. The load circuits 250c may include first to third load circuit groups 251c to 253c. Since the criteria for grouping the first and second LNA groups 231c and 232c are described in detail with reference to FIGS. 1 and 3A, a description thereof will be omitted.

The first load circuit group 251c may be connected to the first LNA group 231c, and load circuits included in the first load circuit group 251c may perform frequency down-conversion on signals output by the first LNA group 231c. The second load circuit group 252c may be connected to the second LNA group 232c, and load circuits included in the second load circuit group 252c may perform frequency down-conversion on signals output by the second LNA group 232c. The third load circuit group 253c may be shared between the first LNA group 231c and the second LNA group 232c and adaptively perform frequency down-conversion on signals output by at least one of the first LNA group 231c and the second LNA group 232c. For example, a plurality of LNAs p1_LNAs of the first LNA group 231c and a plurality of LNAs p2_LNAs of the second LNA group 232c may be selectively connected to the third load circuit group 253c through a switch circuit 241c of the connection circuit 240c and interconnection lines.

The switch circuit 241c may include a larger number of switch elements than the switch circuit 241a of FIG. 3A, and the third load circuit group 253c may include a larger number of load circuits than the third load circuit group 253a of FIG. 3A. By controlling the switch circuit 241c considering a communication method and a communication environment, a plurality of load circuits may be additionally allocated to at least one of the first LNA group 231c and the second LNA group 232c.

Referring to FIG. 5B, the first LNA group 231c may include k LNAs LNA11 to LNA1k, and the second LNA group 232c may include m LNAs LNA21 to LNA2m. The first load circuit group 251c may include (k−2) load circuits LC11 to LC1(k−2), and the second load circuit group 252c may include (m−2) load circuits LC22 to LC2(m−1). The third load circuit group 253c may include three load circuits LC1(k−1), LCk, and LC21.

Each of some LNAs (e.g., first to (k−1)-th LNAs LNA11 to LNA1(k−1)) of the first LNA group 231c may include k output terminals, and the remaining LNA (e.g., a k-th LNA LNA1k) may include k+1 output terminals. The LNAs LNA11 to LNA1k of the first LNA group 231c may be respectively connected to the load circuits LC11 to LC1(k−2) of the first load circuit group 251c through (k−2) interconnection lines 11 to 1(k−2). The LNAs LNA11 to LNA1k may be selectively connected to the load circuit LCk of the third load circuit group 253c through a k-th interconnection line k and a first switch element SWka and selectively connected to the load circuit LC1(k−1) of the third load circuit group 253c through a (k−1)-th interconnection line 1(k−1) and a second switch element SW1(k−1)a. Also, the k-th LNA LNA1k may be selectively connected to the load circuit LC21 of the third load circuit group 253c through a k+1-th interconnection line 1(k+1) and a third switch element SW21a.

Each of some LNAs (e.g., first to (m−1)-th LNAs LNA21 to LNA2(m−1) of the second LNA group 232c may include m output terminals, and the remaining LNA (e.g., an m-th LNA LNA2m) may include m+1 output terminals. The LNAs LNA21 to LNA2m of the second LNA group 232c may be respectively connected to the load circuits LC22 to LC2(m−1) through (m−2) interconnection lines 22 to 2(m−1). The LNAs LNA21 to LNA2m may be selectively connected to the load circuit LCk of the third load circuit group 253c through the k-th interconnection line k and a fourth switch element SWkb, and selectively connected to the load circuit LC21 of the third load circuit group 253c through a first interconnection line 21 and a fifth switch element SW21b. In addition, the m-th LNA LNA2m may be selectively connected to the load circuit LC1(k−1) of the third load circuit group 253c through an m-th interconnection line 2m and a sixth switch element SW1(k−1)b.

In the structure shown in FIG. 5B, by controlling on/off operations of some switch elements SW1(k−1)a, SWka, SWkb, and SW(k−1)b based on a communication method and a communication environment, at least one load circuit (e.g., LC1(k−1) and LCk) may be additionally allocated to the LNAs LNA11 to LNA1k of the first LNA group 231c, or at least one load circuit (e.g., LC1(k−1) and LCk) may be additionally allocated to any one of the LNAs LNA21 to LNA2m of the second LNA group 232c. Also, by controlling on/off operations of other switch elements SW21a and SW21b based on a communication method and a communication environment, the load circuit LC21 may be additionally allocated to the k-th LNA LNA1k of the first LNA group 231c, or the load circuit LC21 may be additionally allocated to the m-th LNA LNA2m of the second LNA group 232c.

Since a configuration of the receiver 200c shown in FIG. 5B is merely an example embodiment, the inventive concept is not limited thereto and may be applied to various embodiments.

Figure 6A:
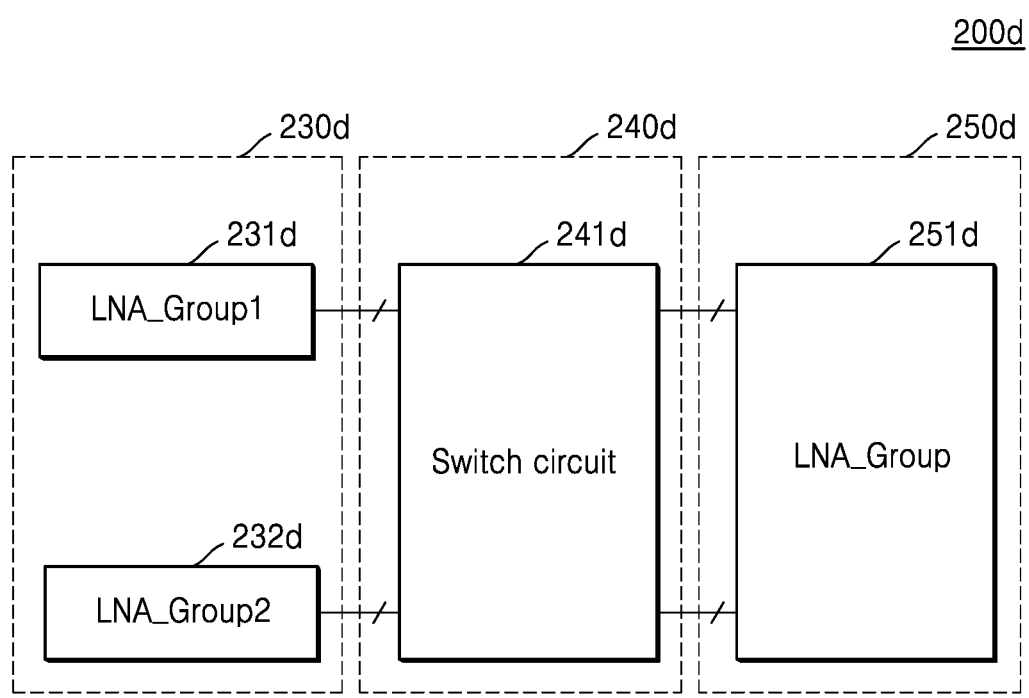
FIG. 6A is a schematic diagram of a receiver according to an example embodiment.
Figure 6B:
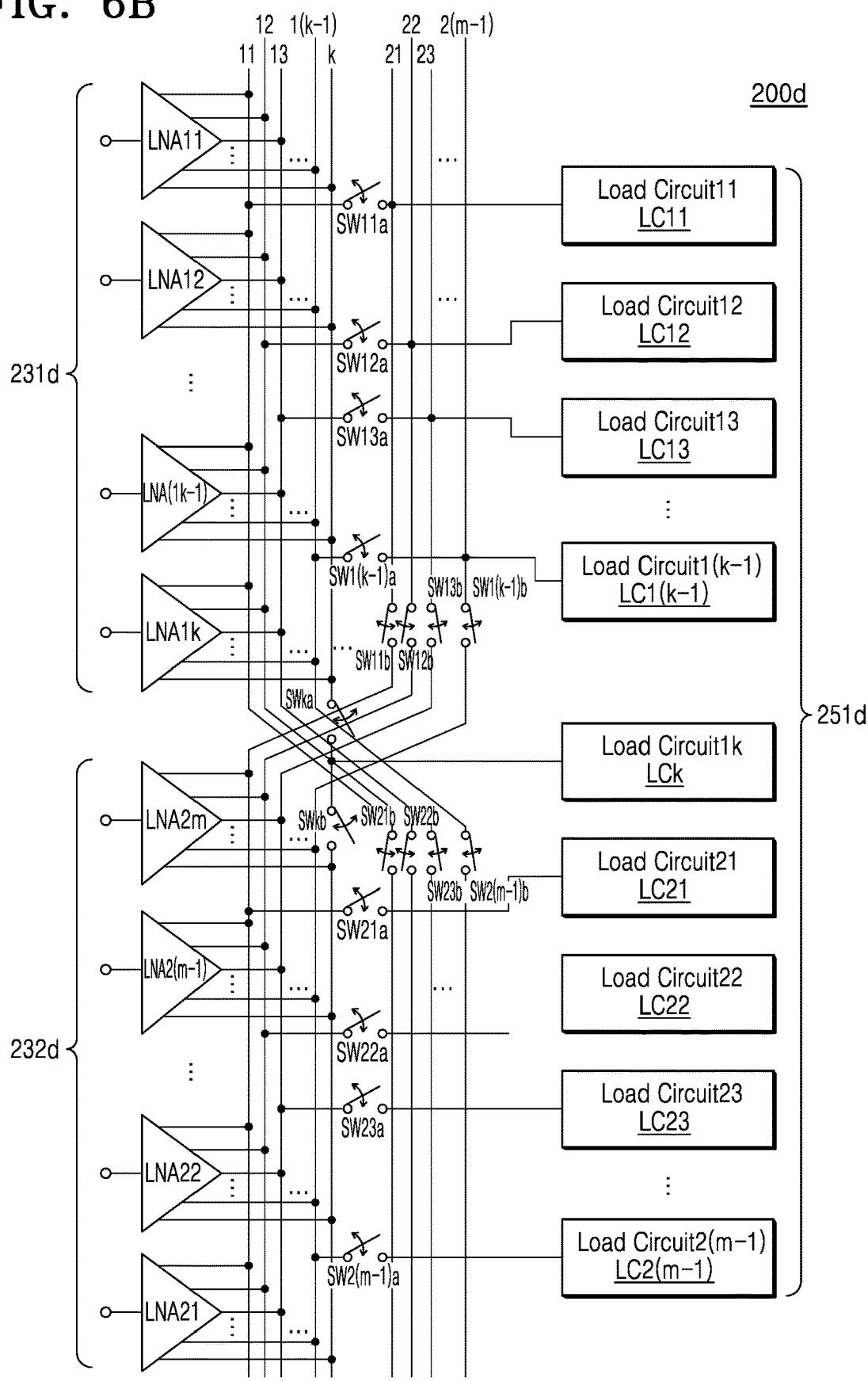
FIG. 6B is a diagram of a specific internal connection relationship of the receiver of FIG. 6A.

FIG. 6A is a schematic diagram of a receiver 200d according to an example embodiment. FIG. 6B is a diagram of a specific internal connection relationship of the receiver 200d of FIG. 6A.

Referring to FIG. 6A, the receiver 200d may include an amplification circuit 230d, a connection circuit 240d, and load circuits 250d. The amplification circuit 230d may include a first LNA group 231d and a second LNA group 232d. The load circuits 250d may include one load circuit group 251d. Since the criteria for grouping the first and second LNA groups 231d and 232d are described in detail with reference to FIGS. 1 and 3A, a description thereof will be omitted.

The load circuit group 251d may be shared between the first LNA group 231d and the second LNA group 232d due to a switch circuit 241d. The switch circuit 241d may include a larger number of switch elements than the switch circuit 241c of FIG. 5A. The switch circuit 241d may be controlled considering a communication method and a communication environment, and thus, a plurality of load circuits may be flexibly allocated to at least one of the first LNA group 231d and the second LNA group 232d.

Referring to FIG. 6B, the first LNA group 231d may include k LNAs LNA11 to LNA1k, and the second LNA group 232d may include m LNAs LNA21 to LNA2m. The load circuit group 251d may include (k+m−1) load circuits LC11 to LC1(k−1), LCk, and LC21 to LC2(m−1).

Each of the LNAs LNA11 to LNA1k of the first LNA group 231d may include k output terminals and be selectively connected to the load circuits LC11 to LC1(k−1), LCk, and LC21 to LC2(m−1) of the load circuit group 251d through (k+m−1) interconnection lines 11 to 1(k−1), k, and 21 to 2(m−1) and switch elements SW11a to SW1(k−1)a, SWka, and SW21b to SW2(m−1)b. Each of the LNAs LNA21 to LNA2m of the second LNA group 232d may include m output terminals and be selectively connected to the load circuits LC11 to LC1(k−1), LCk, and LC21 to LC2(m−1) through the (k+m−1) interconnection lines 11 to 1(k−1), k, and 21 to 2(m−1) and other switch elements SW11b to SW1(k−1)b, SWkb, and SW21a to SW2(m−1)a.

In the structure shown in FIG. 6B, by controlling on/off operations of the switch elements SW11a to SW1(k−1)a, SWka, SW21a to SW2(m−1)a, SW11b to SW1(k−1)b, SWkb, and SW21b to SW2(m−1)b based on a communication method and a communication environment, at least one of the load circuits LC11 to LC1(k−1), LCk, and LC21 to LC2(m−1) may be flexibly allocated to at least one of the LNAs LNA11 to LNA1k of the first LNA group 231d, or at least one of the load circuits LC11 to LC1(k−1), LCk, and LC21 to LC2(m−1) may be flexibly allocated to at least one of the LNAs LNA21 to LNA2m of the second LNA group 232d.

Figure 7:
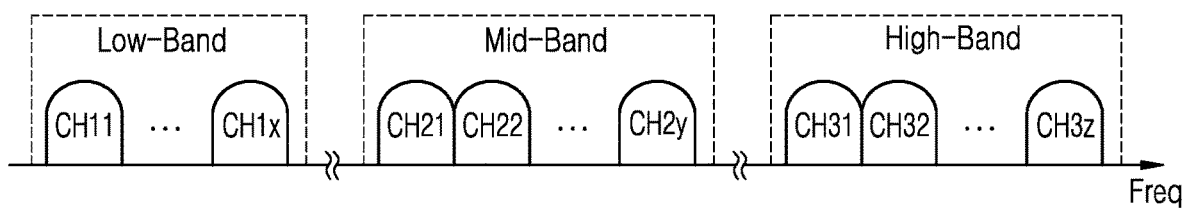
FIG. 7 is a diagram illustrating an embodiment in which a communication method is supported using frequency channels (or carriers) in a plurality of frequency bands.

FIG. 7 is a diagram illustrating an embodiment in which a communication method is supported using frequency channels (or carriers) in a plurality of frequency bands. However, the present embodiment is assumed for simplicity, and the inventive concept is not limited thereto. It will be fully understood that the inventive concept may be also applied to communication methods using a larger or smaller number of bands than in the present embodiment.

Referring to FIG. 7, a wireless communication apparatus according to an example embodiment may perform a communication operation using a plurality of carriers included in each of a low band Low-Band, a mid band Mid-Band, and a high band High-Band. The low band Low-Band may include a plurality of first frequency channels CH11 to CH1x, the mid band Mid-Band may include a plurality of second frequency channels CH21 to CH2y, and the high band High-band may include a plurality of third frequency channels CH31 to CH3z. Each of the low band Low-Band, the mid band Mid-Band, and the high band High-Band may have a frequency range that conforms to a communication standard (e.g., a $5^{th}$-Generation (5G) new-radio (NR)-related communication standard of a $3^{rd}$-Generation partnership project (3GPP)). According to some embodiments, the number of second frequency channels CH21 to CH2y included in the mid band Mid-Band may be greater than the number of first frequency channels CH11 to CH1x included in the low band Low-Band or the number of third frequency channels CH31 to CH3z included in the high band High-Band.

Hereinafter, FIGS. 8A, 8B, and 9 will be described on the assumption that the communication method shown in FIG. 7 is applied.

Figure 8A:
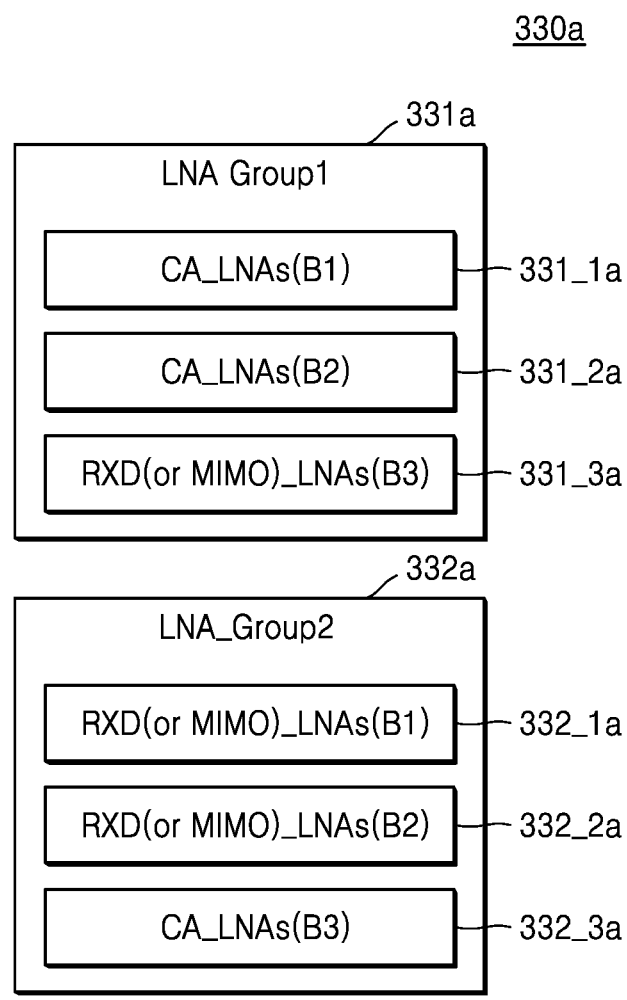
FIGS. 8A and 8B are diagrams of amplification circuits according to example embodiments.
Figure 8B:
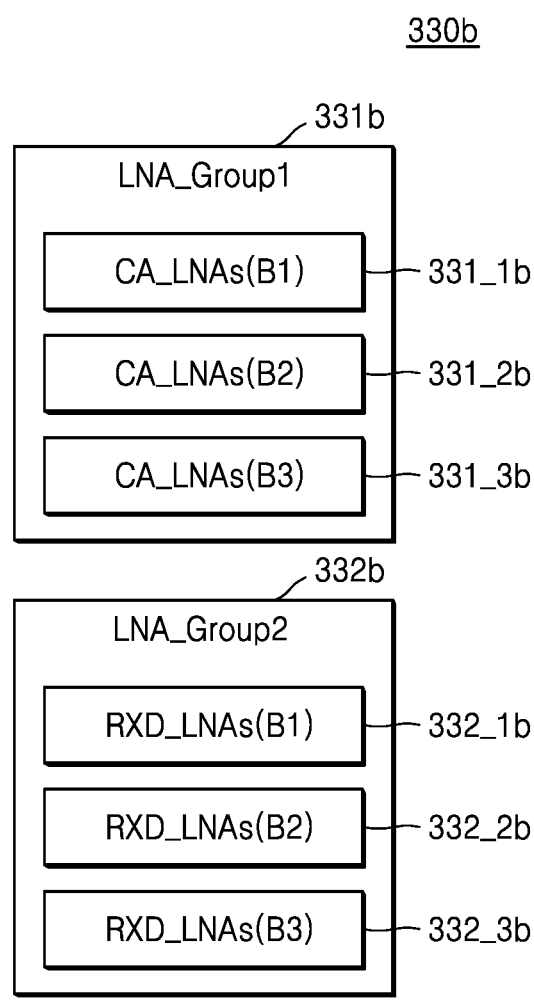

FIGS. 8A and 8B are diagrams of amplification circuits 330a and 330b according to example embodiments.

Referring to FIG. 8A, the amplification circuit 330a may include a first LNA group 331a and a second LNA group 332a. The first LNA group 331a may include first CA LNAs 331_1a configured to amplify signals received through a plurality of carriers of a first frequency band B1 to enable CA-based communication, second CA LNAs 331_2a configured to amplify signals received through a plurality of carriers of a second frequency band B2 to enable CA-based communication, and third RXD (or MIMO) LNAs 331_3a configured to amplify signals received through a plurality of carriers of a third frequency band B3 to enable RXD (or MIMO)-based communication. The numbers of LNAs of the first CA LNAs 331_1a, the second CA LNAs 331_2a, and the third RXD (or MIMO) LNAs 331_3a may be the same or respectively different.

The second LNA group 332a may include fourth RXD (or MIMO) LNAs 332_1a configured to amplify signals received through the plurality of carriers of the first frequency band B1 to enable RXD (or MIMO)-based communication, fifth RXD (or MIMO) LNAs 332_2a configured to amplify signals received through the plurality of carriers of the second frequency band B2 to enable RXD (or MIMO)-based communication, and sixth CA LNAs 332_3a configured to amplify signals received through the plurality of carriers of the third frequency band B3 to enable CA-based communication. The numbers of LNAs of the fourth RXD (or MIMO) LNAs 332_1a, the fifth RXD (or MIMO) LNAs 332_2a, and the sixth CA LNAs 332_3a may be the same or respectively different.

Referring to FIG. 8B, the amplification circuit 330b may include a first LNA group 331b and a second LNA group 332b. The first LNA group 331b may include first CA LNAs 331_1b configured to amplify signals received through the plurality of carriers of the first frequency band B1 to enable CA-based communication, second CA LNAs 331_2b configured to amplify signals received through the plurality of carriers of the second frequency band B2 to enable CA-based communication, and third CA LNAs 331_3b configured to amplify signals received through the plurality of carriers of the third frequency band B3, to enable CA-based communication. The numbers of LNAs of the first CA LNAs 331_1b, the second CA LNAs 331_2b, and the third CA LNAs 331_3b may be the same or respectively different.

The second LNA group 332b may include fourth RXD (or MIMO) LNAs 332_1b configured to amplify signals received through the plurality of carriers of the first frequency band B1 to enable RXD (or MIMO)-based communication, fifth RXD (or MIMO) LNAs 332_2b configured to amplify signals received through the plurality of carriers of the second frequency band B2 to enable RXD (or MIMO)-based communication, and sixth RXD (or MIMO) LNAs 332_3b configured to amplify signals received through the plurality of carriers of the third frequency band B3 to enable RXD (or MIMO)-based communication. The numbers of LNAs of the fourth RXD (or MIMO) LNAs 332_1b, the fifth RXD (or MIMO) LNAs 332_2b, and the sixth RXD (or MIMO) LNAs 332_3b may be the same or respectively different.

However, since FIGS. 8A and 8B are merely example embodiments, when carriers are used in more frequency bands, LNAs may be grouped based on various criteria. The criteria may reflect factors that may be optimally designed to additionally allocate load circuits.

Figure 9:
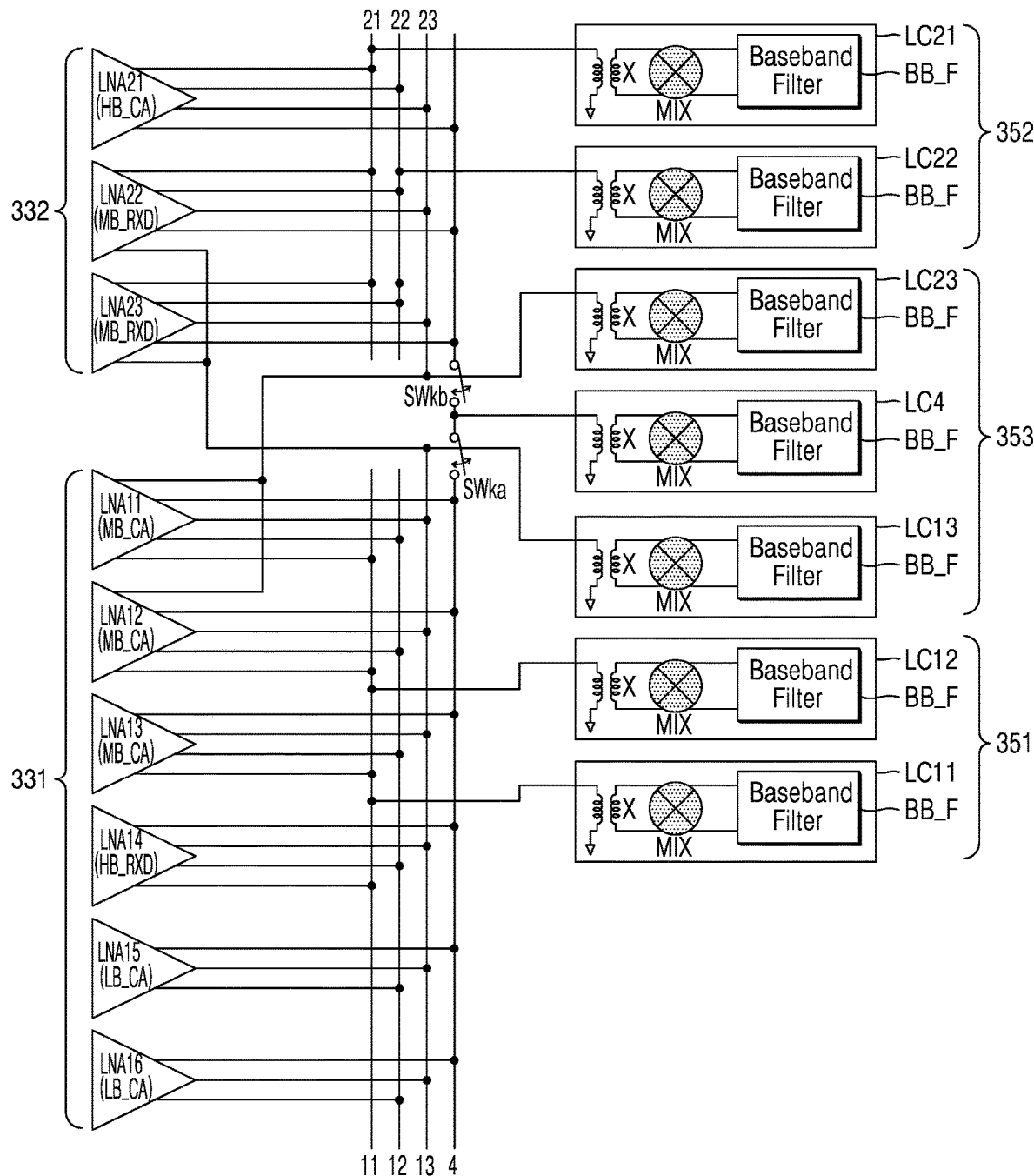
FIG. 9 is a diagram of a receiver according to an example embodiment.

FIG. 9 is a diagram of a receiver 300 according to an example embodiment.

Referring to FIG. 9, the receiver 300 may include first and second LNA groups 331 and 332, a plurality of switch elements (e.g., SWka and SWkb), and first to third load circuit groups 351 to 353. The first LNA group 331 may include a plurality of LNAs (e.g., LNA11 to LNA16). Each of a first LNA LNA11 and a second LNA LNA12 of the first LNA group 331 may include five output terminals, and each of the remaining LNAs LNA13 to LNA16 may include four output terminals. Some LNAs (e.g., LNA11, LNA12, and LNA13) of the first LNA group 331 may amplify signals, which are received through a plurality of carriers of a mid band MB, to enable CA-based communication, and some other LNAs (e.g., LNA14) may amplify signals, which are received through at least one carrier of a high band HB, to enable RXD (or MIMO)-based communication. Still other LNAs (e.g., LNA15 and LNA16) may amplify signals, which are received through a plurality of carriers of a low band LB, to enable CA-based communication.

In some embodiments, mid-band (MB) frequency channels corresponding to carrier signals that are respectively amplified by some LNAs (e.g., LNA11, LNA12, and LNA13) may be different from each other, and low-band (LB) frequency channels corresponding to carrier signals that are respectively amplified by some other LNAs (e.g., LNA15 and LNA16) may be different from each other.

The second LNA group 332 may include a plurality of LNAs (e.g., LNA21 to LNA23). Each of a second LNA LNA22 and a third LNA LNA23 of the second LNA group 332 may include five output terminals, and the remaining LNA LNA21 may include four output terminals. Some LNAs (e.g., LNA21) of the second LNA group 332 may amplify signals, which are received through at least one carrier of a high band HB, to enable CA-based communication. Still other LNAs (e.g., LNA22 and LNA23) may amplify signals, which are received through a plurality of carriers of a mid band MB, to enable RXD (or MIMO)-based communication.

In some embodiments, mid band (MB) frequency channels corresponding to carrier signals that are respectively amplified by the still other LNAs (e.g., LNA22 and LNA23) of the second LNA group 332 may be different from each other.

The first load circuit group 351 may include a plurality of load circuits (e.g., LC11 and LC12), and the second load circuit group 352 may include a plurality of load circuits (e.g., LC21 and LC22). The third load circuit group 353 may include a plurality of load circuits (e.g., LC13, LC4, and LC23). The load circuits LC11 to LC13, LC4, and LC21 to LC23 may include a transformer X, a mixer X, and a baseband filter BB_F. The transformer X may include a primary coil configured to receive a signal amplified by an LNA and a secondary coil configured to provide a differential signal derived from the received signal. Thus, the transformer X may function as a passive balance and unbalance (or passive balun). A balun may refer to a circuit configured to convert a single phase signal into a differential phase signal. The mixer MIX may perform frequency down-conversion on a signal output by the transformer X. In this case, the mixer MIX may receive a frequency signal having an appropriate frequency. The baseband filter BB_F may filter the down-converted signal and output the filtered signal as a base band signal.

The load circuits LC11 and LC12 of the first load circuit group 351 may be connected to the LNAs LNA11 to LNA16 of the first LNA group 331 through interconnection lines 11 and 12, respectively. The load circuits LC21 and LC22 of the second load circuit group 352 may be connected to the LNAs LNA21 to LNA23 of the second LNA group 332 through interconnection lines 21 and 22, respectively. The first LNA LNA11 and the second LNA LNA12 of the first LNA group 331 may be further connected to the load circuit LC23 of the third load circuit group 353 through an interconnection line 23, and the second LNA LNA22 and the third LNA LNA23 of the second LNA group 332 may be further connected to the load circuit LC13 of the third load circuit group 353 through an interconnection line 13. In addition, the LNAs LNA11 to LNA16 of the first LNA group 331 may be selectively further connected to the load circuit LC4 of the third load circuit group 353 through a first switch element SWka and an interconnection line 4, and the LNAs LNA21 to LNA23 of the second LNA group 332 may be selectively further connected to the load circuit LC4 of the third load circuit group 353 through a second switch element SWkb and an interconnection line 4.

Furthermore, the receiver 300 shown in FIG. 9 may perform communication using up to seven carriers. Thus, the number of load circuits LC11 to LC13, LC4, and LC21 to LC23 may be 7, which corresponds to the maximum number of available carriers.

For example, by controlling on/off operations of the first switch element SWka based on a communication method and a communication environment, the load circuit LC4 of the third load circuit group 353 may be additionally allocated to any one of the LNAs LNA11 to LNA16 of the first LNA group 331. Alternatively, by controlling on/off operations of the second switch element SWkb, the load circuit LC4 may be allocated to any one of the LNAs LNA21 to LNA23 of the second LNA group 332. In addition, based on a communication method and a communication environment, the load circuit LC23 of the third load circuit group 353 may be additionally allocated to the first LNA LNA11 or the second LNA LNA12 of the first LNA group 331, or the load circuit LC13 of the third load circuit group 353 may be additionally allocated to the second LNA LNA22 or the third LNA LNA23 of the second LNA group 332.

Figure 10:
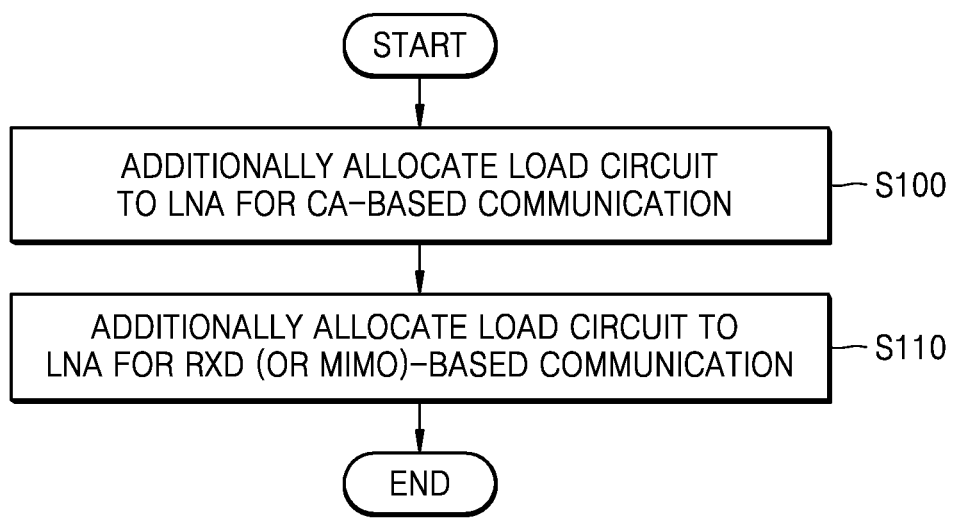
FIG. 10 is a flowchart of an additional allocation method of a load circuit of a wireless communication apparatus, according to an example embodiment.

FIG. 10 is a flowchart of an additional allocation method of a load circuit of a wireless communication apparatus, according to an example embodiment. Hereinafter, the flowchart of FIG. 10 will be described with reference to FIG. 9 for brevity.

Referring to FIG. 10, a wireless communication apparatus may additionally allocate a load circuit to an LNA for CA-based communication considering a communication method and a communication environment (S100). In an example embodiment, the wireless communication apparatus may preferentially allocate the load circuit LC4 of the third load circuit group 353 to the first LNA LNA11 or the second LNA LNA12 of the first LNA group 331. After operation S100, the wireless communication apparatus may additionally allocate a load circuit to an LNA for RXD (or MIMO)-based communication considering a communication method and a communication environment (S110). In an example embodiment, when the load circuit LC4 of the third load circuit group 353 is not allocated to the first LNA LNA11 or the second LNA LNA12 of the first LNA group 331, the wireless communication apparatus may allocate the load circuit LC4 to the second LNA LNA22 or the third LNA LNA23 of the second LNA group 332 in the next order.

Figure 11:
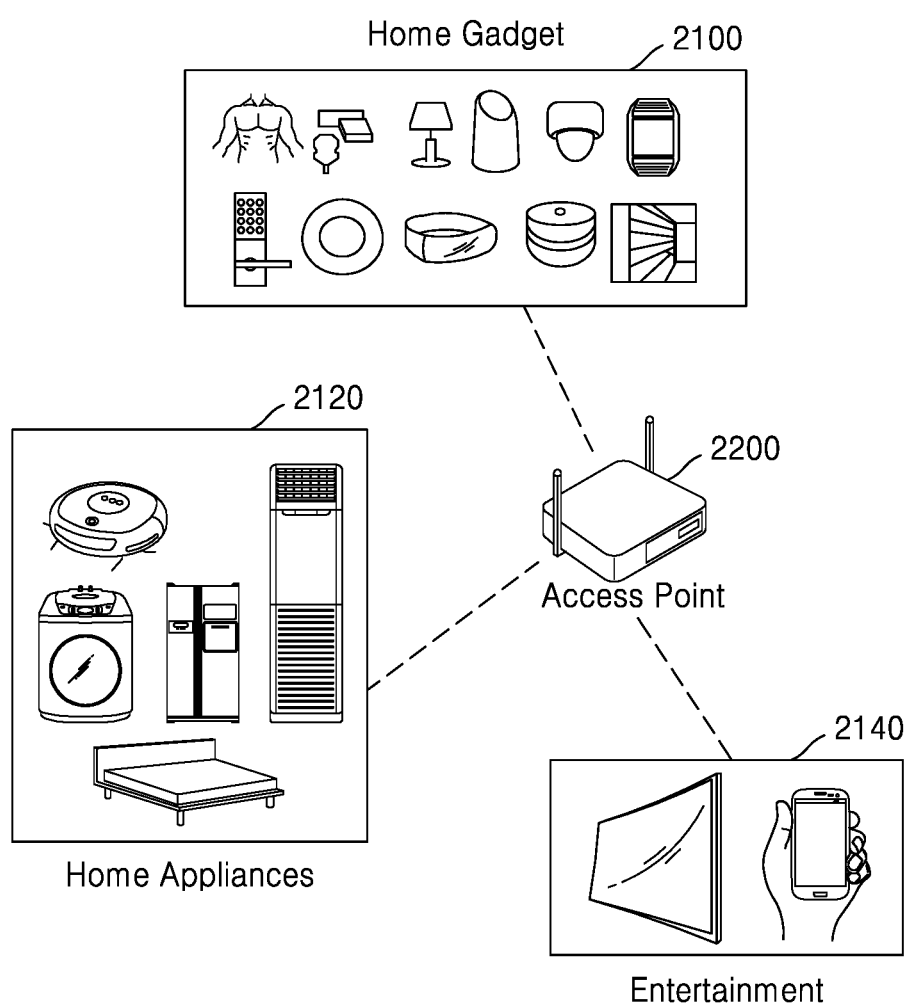
FIG. 11 is a diagram of communication devices including receivers according to an example embodiment.

FIG. 11 is a diagram of communication devices including receivers according to an example embodiment.

Referring to FIG. 11, each of home gadgets 2100, home appliances 2120, entertainment devices 2140, and an access point (AP) 2200 may include a plurality of receivers according to embodiments. In some embodiments, the home gadgets 2100, the home appliances 2120, the entertainment device 2140, and the AP 2200 may constitute an Internet of Things (IoT) network system. It will be understood that the communication devices shown in FIG. 11 are merely examples, and a wireless communication apparatus according to an example embodiment may be also included in other communication devices that are not shown in FIG. 11.

Figure 12:
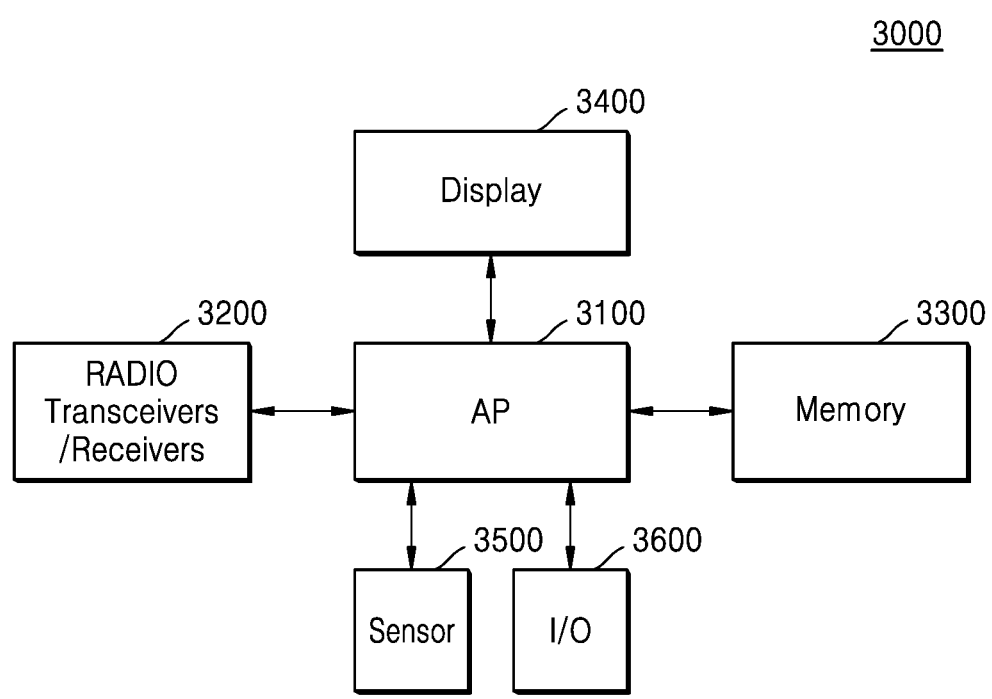
FIG. 12 is a block diagram of Internet of Things (IoT) equipment according to an example embodiment.

FIG. 12 is a block diagram of IoT equipment 3000 according to an example embodiment.

Referring to FIG. 12, the IoT equipment 3000 may include an application processor 3100, receivers 3200, a memory 3300, a display 3400, a sensor 3500, and an input/output (I/O) element 3600.

The IoT equipment 3000 may communicate with the outside through the receivers 3200. The receivers 3200 may include, for example, local area network (LAN), a wireless LAN (WLAN) interface (e.g., Bluetooth, wireless fidelity (WiFi), and Zigbee), power line communication (PLC), a modem communication interface that is accessible to a mobile cellular network, such as $3^{rd}$ Generation (3G), long-term evolution (LTE), and $5^{th}$ Generation (5G). Configurations according to the above-described embodiments may be applied to the receivers 3200. That is, a structure capable of additionally allocating a load circuit to a predetermined LNA based on a communication method and a communication environment may be applied to the IoT equipment 3000.

The application processor 3100 may control the overall operation of the IoT equipment 3000 and operations of components of the IoT equipment 3000. The application processor 3100 may perform various operations. In some embodiments, the application processor 3100 may include one processor core (or a single core) or a plurality of processor cores (or a multi-core).

The sensor 3500 may be, for example, an image sensor configured to sense an image. The sensor 3500 may be connected to the application processor 3100 and transmit generated image information to the application processor 3100. The sensor 3500 may be a biosensor configured to sense biometric information. The sensor 3500 may be an arbitrary sensor, such as an illuminance sensor, an acoustic sensor, and an acceleration sensor.

The display 3400 may display inner state information about the IoT equipment 3000. The display 3400 may include a touch sensor (not shown). Also, the display 3400 may include an input or output function for a user interface and an outer appearance. A user may control the IoT equipment 3000 using the touch sensor and the user interface.

The I/O element 3600 may include an input unit, such as a touch pad, a keypad, and an input button, and an output unit, such as a display and a speaker. The memory 3300 may store a control instruction code, control data, or user data for controlling the IoT equipment 3000. The memory 3300 may include at least one of a volatile memory and a non-volatile memory.

The IoT equipment 3000 may include a battery embedded therein to supply internal power or further include a power supply unit configured to receive power from the outside. Also, the IoT equipment 3000 may further include a storage device. The storage device may be a non-volatile medium, such as a hard disk drive (HDD), a solid state disk (SSD), an embedded multimedia card (eMMC), and a universal flash storage (UFS). The storage device may store user information, which is provided through the I/O element 3600, and sensing information, which is collected by the sensor 3500.

While the inventive concept has been particularly shown and described with reference to embodiments thereof, it will be understood that various changes in form and details may be made therein without departing from the spirit and scope of the following claims.

What is claimed is:

1. A radio-frequency integrated chip (RFIC) comprising:
a first low-noise amplifier (LNA) group, wherein the first LNA group comprises a first plurality of LNAs, the first plurality of LNAs is configured to amplify a plurality of first carrier signals, and the plurality of first carrier signals correspond to at least a first one of a plurality of frequency bands;
a second LNA group, wherein the second LNA group comprises a second plurality of LNAs, the second plurality of LNAs is configured to amplify a plurality of second carrier signals, and the plurality of second carrier signals correspond to at least a second one of the plurality of frequency bands;
a first load circuit group, wherein the first load circuit group is configured as dedicated to the first LNA group, the first load circuit group comprises a first plurality of load circuits, wherein the first plurality of load circuits is configured to perform a frequency down-conversion of the plurality of first carrier signals amplified by the first LNA group;
a second load circuit group, wherein the second load circuit group is configured as dedicated to the second LNA group, the second load circuit group comprises a second plurality of load circuits, wherein the second plurality of load circuits is configured to perform a frequency down-conversion of the plurality of second carrier signals amplified by the second LNA group; and
a third load circuit group, wherein the third load circuit group is configured as shared between the first LNA group and the second LNA group, the third load circuit group comprises at least one third load circuit, the at least one third load circuit is configured to perform a frequency down-conversion of a third carrier signal, the third carrier signal amplified by either the first LNA group or the second LNA group.

2. The RFIC of claim 1, wherein
the first plurality of LNAs comprises first LNAs and second LNAs, the first LNAs are configured to support carrier aggregation (CA), and the second LNAs are configured to support receive diversity or multiple input and multiple output,
wherein the second plurality of LNAs comprise third LNAs and fourth LNAs, wherein the third LNAs are configured to support CA, and the fourth LNAs are configured to support receive diversity or multiple input and multiple output.

3. The RFIC of claim 2, wherein
a first frequency band that is coverable by the first LNAs is different from a second frequency band that is coverable by the third LNAs, and
a third frequency band that is coverable by the second LNAs is different from a fourth frequency band that is coverable by the fourth LNAs.

4. The RFIC of claim 3, wherein
the plurality of frequency bands comprises a low band, a mid band, and a high band,
the first frequency band comprises the low band and the mid band, the second frequency band comprises the high band, the third frequency band comprises the high band, and the fourth frequency band comprises the mid band.

5. The RFIC of claim 1, wherein
the first plurality of LNAs are configured to support carrier aggregation (CA), and
the second plurality of LNAs are configured to support receive diversity or multiple input and multiple output.

6. The RFIC of claim 5, wherein
a first frequency band that is coverable by the first plurality of LNAs is equal to a third frequency band that is coverable by the second plurality of LNAs.

7. The RFIC of claim 1, further comprising a plurality of switch elements, wherein the plurality of switch elements is configured to selectively connect a first LNA of the first plurality of LNAs and a second LNA of the second plurality of LNAs to the at least one third load circuit.

8. The RFIC of claim 1, wherein the first plurality of LNAs comprises a first LNA, the second plurality of LNAs comprises a second LNA, and the third load circuit group comprises a first load circuit, and
wherein the RFIC further comprises:
a first switch element connected between the first LNA and the first load circuit, and
a second switch element connected between the second LNA and the first load circuit.

9. The RFIC of claim 8, wherein the first plurality of LNAs further comprises a third LNA, the second plurality of LNAs further comprises a fourth LNA, and the third load circuit group further comprises a second load circuit, and
wherein the third LNA is directly connect to the second load circuit and the fourth LNA is directly connected to the second load circuit.

10. The RFIC of claim 8, wherein the first plurality of LNAs further comprises a third LNA, the second plurality of LNAs further comprises a fourth LNA, and the third load circuit group further comprises a second load circuit,
wherein the RFIC further comprises:
a third switch element connected between the third LNA and the second load circuit, and
a fourth switch element connected between the fourth LNA and the second load circuit.

11. The RFIC of claim 1, wherein
when a first number of frequency channels provided to the first LNA group exceeds a second number of the first plurality of LNAs and a third number of frequency channels provided to the second LNA group exceeds a fourth number of the second plurality of LNAs:
a first LNA of the first plurality of LNAs, is connected to the third load circuit group, and
a second LNA of the second plurality of LNAs is connected to the third load circuit group.

12. The RFIC of claim 1, wherein
a sum of: i) a first number of the first plurality of load circuits, ii) a second number of the second plurality of load circuits, and iii) a third number of load circuits of the third load circuit group corresponds to a maximum number of available carriers of the RFIC.

13. A wireless communication apparatus comprising:
a first antenna; and
a first receiver connected to the first antenna,
wherein the first receiver comprises:
a plurality of first low-noise amplifier (LNA) groups, wherein each LNA group of the plurality of first LNA groups comprises a first plurality of LNAs, wherein the first plurality of LNAs is configured to amplify a first plurality of carrier signals corresponding to at least a first one of a plurality of frequency bands;

a plurality of first dedicated load circuit groups respectively configured as allocated to the plurality of first LNA groups in a one-to-one manner, each dedicated load circuit group of the plurality of first dedicated load circuit groups comprising a plurality of load circuits, each of the first dedicated load circuit groups being configured to perform a frequency down-conversion of the first plurality of carrier signals amplified by the first plurality of LNAs of each of the first LNA groups; and a first shared load circuit group, wherein the first shared load circuit group is configured as shared among the plurality of first LNA groups, the first shared load circuit group comprising at least one load circuit configured to perform a frequency down-conversion on the first plurality of carrier signals amplified by at least one of the first plurality of LNAs.

14. The wireless communication apparatus of claim 13, further comprising:
a second antenna; and
a second receiver connected to the second antenna,
wherein the second receiver comprises:
a plurality of second LNA groups, wherein each LNA group of the plurality of second LNA groups comprises a second plurality of LNAs, wherein the second plurality of LNAs is configured to amplify a second plurality of carrier signals corresponding to at least a second one of the plurality of frequency bands;
a plurality of second dedicated load circuit groups respectively configured as allocated to the plurality of second LNA groups in a one-to-one manner, each second dedicated load circuit group of the plurality of second dedicated load circuit groups comprising a plurality of load circuits, each second dedicated load circuit group being configured to perform a frequency down-conversion of the second plurality of carrier signals amplified by the second plurality of LNAs of each of the second LNA groups; and
a second shared load circuit group, wherein the second shared load circuit group is configured as shared among the second LNA groups, the second shared load circuit group comprising at least one load circuit configured to perform a frequency down-conversion on the second plurality of carrier signals amplified by at least one of the second plurality of LNAs.

15. The wireless communication apparatus of claim 13, further comprising a first baseband processor configured to control the first receiver,
wherein the first baseband processor is further configured to allocate at least one load circuit included in the first shared load circuit group to at least one of the first LNA groups, based on first control information.

16. The wireless communication apparatus of claim 13, wherein the first receiver further comprises a connection circuit, the connection circuit comprises a plurality of switch elements, and the connection circuit is configured to selectively connect one of the first plurality of LNAs to the first shared load circuit group.

17. The wireless communication apparatus of claim 16, further comprising a second baseband processor configured to control the connection circuit,
wherein the second baseband processor is configured to control on/off operations of the plurality of switch elements based on second control information to selectively connect the at least one load circuit to one of the first plurality of LNAs.

18. The wireless communication apparatus of claim 13, wherein some of the first plurality of LNAs are connected to the at least one load circuit, and
some others of the first plurality of LNAs are not connected to the at least one load circuit.

19. The wireless communication apparatus of claim 13, wherein a first frequency band that is coverable by each of the first plurality of LNAs in a carrier aggregation based communication is different from a second frequency band that is coverable by each of the first plurality of LNAs in communication based on receive diversity or multiple input and multiple output.

20. A wireless communication apparatus comprising:
a plurality of antennas;
a plurality of receivers respectively connected to the plurality of antennas; and
a baseband processor configured to control the plurality of receivers,
wherein each of the plurality of receivers comprises:
a plurality of low-noise amplifier (LNA) groups, each LNA group of the plurality of LNA groups comprising a plurality of LNAs, the plurality of LNAs configured to amplify a plurality of carrier signals, the plurality of carrier signals corresponding to at least one of a plurality of frequency bands;
a plurality of dedicated load circuit groups respectively allocated to the plurality of LNA groups in a one-to-one manner, each dedicated load circuit group of the plurality of dedicated load circuit groups comprising a plurality of load circuits, each plurality of the load circuits configured to perform a frequency down-conversion of the plurality of carrier signals; and
a shared load circuit group configured as shared among the plurality of LNA groups, the shared load circuit group comprising at least one load circuit, the at least one load circuit configured to perform a frequency down-conversion of a first carrier signal amplified by at least one LNA of the plurality of LNAs,
wherein the baseband processor is further configured to allocate the at least one load circuit to at least one of the plurality of LNA groups, based on control information.

* * * * *